US012796119B2

(12) United States Patent
Kamatani et al.

(10) Patent No.: US 12,796,119 B2
(45) Date of Patent: Nov. 10, 2026

(54) SEMICONDUCTOR CHIP, METHOD FOR MANUFACTURING THE SAME, AND ELECTRONIC DEVICE

(71) Applicant: SONY SEMICONDUCTOR SOLUTIONS CORPORATION, Kanagawa (JP)

(72) Inventors: Ryosuke Kamatani, Kanagawa (JP); Tomiyuki Yukawa, Kanagawa (JP); Atsushi Yamamoto, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 346 days.

(21) Appl. No.: 18/558,198

(22) PCT Filed: Feb. 4, 2022

(86) PCT No.: PCT/JP2022/004382
§ 371 (c)(1),
(2) Date: Oct. 31, 2023

(87) PCT Pub. No.: WO2022/244327
PCT Pub. Date: Nov. 24, 2022

(65) Prior Publication Data

US 2024/0213290 A1 Jun. 27, 2024

(30) Foreign Application Priority Data

May 17, 2021 (JP) ................................ 2021-083153

(51) Int. Cl.
*H10F 39/18* (2025.01)
*H04N 23/60* (2023.01)
(Continued)

(52) U.S. Cl.
CPC ........... *H10F 39/182* (2025.01); *H04N 23/60* (2023.01); *H10F 39/014* (2025.01);
(Continued)

(58) Field of Classification Search
None
See application file for complete search history.

(56) References Cited

U.S. PATENT DOCUMENTS

2010/0044819 A1* 2/2010 Jeong .................. H10F 39/8063 257/E31.127
2013/0292646 A1* 11/2013 Iguchi .................. H10F 39/024 438/69
2014/0376097 A1* 12/2014 Yamashita ........... G02B 3/0018 359/619

FOREIGN PATENT DOCUMENTS

JP 2000-156486 A 6/2000
JP 2004-235635 A 8/2004
(Continued)

OTHER PUBLICATIONS

International Search Report and Written Opinion of PCT Application No. PCT/JP2022/004382, issued on May 10, 2022, 09 pages of ISRWO.

*Primary Examiner* — Anthony Ho
(74) *Attorney, Agent, or Firm* — CHIP LAW GROUP

(57) ABSTRACT

The present technology relates to a semiconductor chip, a method for manufacturing the same, and an electronic device that can improve reliability and durability. The semiconductor chip includes a solid-state imaging element such as a complementary metal oxide semiconductor (CMOS) image sensor (CIS), a glass substrate provided on the solid-state imaging element, and a lens formed on the glass substrate. The glass substrate has a groove having a depth of L1-L2 around a region where the lens is formed. The present technology can be applied, for example, to a semiconductor
(Continued)

chip or the like that is a wafer level chip size package (WCSP) having a solid-state imaging element such as a CIS.

13 Claims, 29 Drawing Sheets

(51) Int. Cl.
*H10F 39/00* (2025.01)
*H10P 14/20* (2026.01)

(52) U.S. Cl.
CPC ....... *H10F 39/805* (2025.01); *H10F 39/8063* (2025.01); *H10P 14/2922* (2026.01)

(56) References Cited

FOREIGN PATENT DOCUMENTS

| | | | |
|---|---|---|---|
| JP | 2012-160691 | A | 8/2012 |
| JP | 2019-213151 | A | 12/2019 |
| WO | 2013/133225 | A1 | 9/2013 |
| WO | 2019/235247 | A1 | 12/2019 |

* cited by examiner

SEMICONDUCTOR CHIP, METHOD FOR MANUFACTURING THE SAME, AND ELECTRONIC DEVICE

CROSS REFERENCE TO RELATED APPLICATIONS

This application is a U.S. National Phase of International Patent Application No. PCT/JP2022/004382 filed on Feb. 4, 2022, which claims priority benefit of Japanese Patent Application No. JP 2021-083153 filed in the Japan Patent Office on May 17, 2021. Each of the above-referenced applications is hereby incorporated herein by reference in its entirety.

TECHNICAL FIELD

The present technology relates to a semiconductor chip, a method for manufacturing the same, and an electronic device, and more particularly to a semiconductor chip, a method for manufacturing the same, and an electronic device capable of improving reliability and durability.

BACKGROUND ART

In recent years, there is known an imaging device in which a lowermost layer lens among a plurality of lenses that focuses incident light on a light-receiving surface of a solid-state imaging element is formed on a foremost stage of an integrated configuration unit in which the solid-state imaging element, a glass substrate, an infrared (IR)-cut filter are laminated.

In such an imaging device, it has been devised to form a hemming portion at the boundary with a glass substrate on an outer peripheral side surface of the lowermost layer lens so that the lowermost layer lens is more strongly bonded to the glass substrate (see, for example, PTL 1).

In addition, it has been devised to apply an anti-reflection (AR) coating to the lowermost layer lens to prevent reflection (see, for example, PTL 2). This AR coating is, for example, is a resin such as acrylic resin, epoxy resin, or styrene resin, an insulation film (for example, SiCH, SiCOH, and SiCNH) mainly containing Si (silicon), C (carbon), and H (hydrogen), an insulation film (for example, SiON and SiN) mainly containing Si (silicon) and N (nitrogen), or an SiO2 film, a P—SiO film, or a HDP-SiO film formed using an oxidant and an material gas which is at least any one of silicon hydroxide, alkylsilane, alkoxysilane, polysiloxane, and the like.

CITATION LIST

Patent Literature

[PTL 1]
JP 2019-213151A
[PTL 2]
WO 2019/235247

SUMMARY

Technical Problem

By the way, as a method for forming the lowermost layer lens on the glass substrate laminated on the solid-state imaging element, for example, there is known a method in which a lens resin, which is a photocurable resin, is applied to a lens region on the glass substrate where the lowermost layer lens is formed, and the lens resin is exposed using a mold with a light shielding mask having a shape corresponding to a desired shape of the lowermost layer lens. In this method, the lowermost layer lens having a desired shape is formed by performing a cleaning treatment after the exposure to remove an unexposed (uncured) lens resin and the like.

However, it is difficult to control the shape of the end portion of the lowermost layer lens with high accuracy due to the influence of refraction of exposure light. As a result, when a hemming portion (lens hem) formed at the end portion comes into contact with the uncured lens resin and the like, which are removed by the cleaning treatment, a portion of the hemming portion together with the uncured lens resin and the like may peel off due to the cleaning treatment and cracks may occur. If this crack reduces the adhesion force between the glass substrate and the lowermost layer lens, lens peel-off may occur. Therefore, it is desired to suppress the occurrence of such cracks and improve reliability and durability.

The present technology has been made in view of such circumstances, and is intended to improve reliability and durability.

Solution to Problem

A semiconductor chip according to a first aspect of the present technology includes: an imaging element; a glass substrate provided on the imaging element; and a lens formed on the glass substrate, wherein the glass substrate has a groove around a region where the lens is formed.

A manufacturing method according to a second aspect of the present technology is a method for manufacturing a semiconductor chip, including: forming a groove around a region where a lens is formed, on a glass substrate provided on an imaging element; and forming the lens in the region of the glass substrate where the lens is formed.

An electronic device according to a third aspect of the present technology is an electronic device including: a semiconductor chip including: an imaging element; a glass substrate provided on the imaging element; and a lens formed on the glass substrate; and the glass substrate having a groove around a region where the lens is formed, a signal processing circuit that processes signals from the semiconductor chip.

In the first aspect of the present technology, an imaging element, a glass substrate provided on the imaging element, and a lens formed on the glass substrate are provided, and the glass substrate has a groove around a region where the lens is formed.

In the second aspect of the present technology, a groove is formed around a region where a lens is formed, of a glass substrate provided on an imaging element, and the lens is formed on the region of the glass substrate where the lens is formed.

In the third aspect of the present technology, a semiconductor chip including an imaging element, a glass substrate provided on the imaging element, and a lens formed on the glass substrate, the glass substrate having a groove around a region where the lens is formed, and a signal processing circuit for processing signals from the semiconductor chip are provided.

DESCRIPTION OF EMBODIMENTS

Modes for embodying the present technology (hereinafter referred to as embodiments) will be described below. Note that the description will be made in the following order.

1. First embodiment (semiconductor chip having convex lens)
2. Second embodiment (semiconductor chip in which cross-sectional shape of bottom of groove is sawtooth shape)
3. Third embodiment (semiconductor chip with AR coating)
4. Fourth embodiment (semiconductor chip with square concave lens)
5. Application example to electronic device
6. Usage example of semiconductor chip
7. Application example to endoscopic surgery system
8. Application example to moving body Note that, in drawings to be referred to in the following description, same or similar portions are denoted by same or similar reference signs. However, the drawings are schematic and relationships between thicknesses and plan view dimensions, ratios of thicknesses of respective layers, and the like differ from those in real. In addition, drawings include portions where dimensional relationships and ratios differ between the drawings in some cases.

In addition, it is to be understood that definitions of directions such as upward and downward in the following description are merely definitions provided for the sake of brevity and are not intended to limit technical ideas of the present disclosure. For example, when an object is observed after being rotated by 90 degrees, up-down is converted into and interpreted as left-right, and when an object is observed after being rotated by 180 degrees, up-down is interpreted as being inverted.

First Embodiment

<First Configuration Example of Semiconductor Chip>

Figure 1:
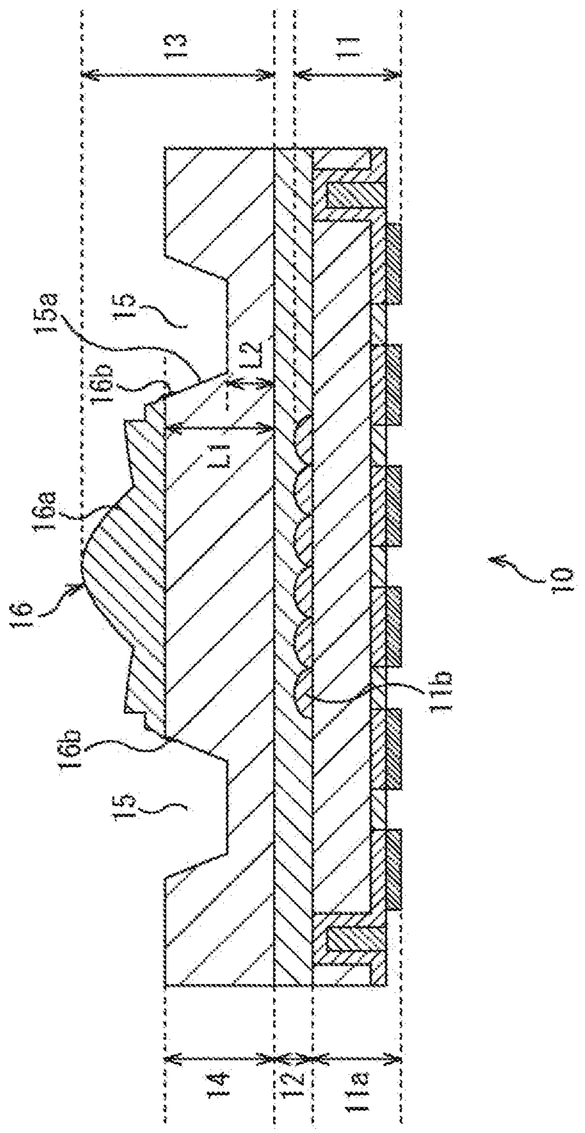
FIG. 1 is a cross-sectional view showing a first configuration example of a first embodiment of a semiconductor chip to which the present technology is applied.

FIG. 1 is a cross-sectional view showing a first configuration example of a first embodiment of a semiconductor chip to which the present technology is applied.

As shown in FIG. 1, a semiconductor chip 10 is a wafer level chip size package (WCSP) having a solid-state imaging element 11 such as a complementary metal oxide semiconductor (CMOS) image sensor (CIS). The solid-state imaging element 11 is constructed by forming an on-chip lens 11*b* on a laminated substrate 11*a* formed by laminating semiconductor substrates. An integrated portion 13 is provided on the solid-state imaging element 11 with an adhesive 12 interposed therebetween. The integrated portion 13 is configured by laminating a glass substrate 14 and a lens 16 in order.

A groove 15 is formed in a region of the glass substrate 14 where the lens 16 is not formed around the region where the lens 16 is formed. Here, assuming that the thickness of the region of the glass substrate 14 other than the groove 15 is L1, the thickness of the groove 15 is L2 (L1>L2). Further, a side surface 15*a* of the groove 15 is inclined, but this inclination occurs unintentionally when the glass substrate 14 is etched to form the groove 15. The side surface 15*a* of the groove 15 is ideally a vertical surface.

The lens 16, which is a convex acrylic lens, is formed in a region on the glass substrate 14 corresponding to the on-chip lens 11*b*. The lens 16 is composed of a main portion 16*a* having a desired shape and a hemming portion 16*b* which is unintentionally formed at the end portion of the lens 16 during manufacturing. The lens 16 is a lowermost layer lens among a plurality of lenses that focuses incident light on a light-receiving surface (not shown) formed in a region on the surface of the laminated substrate 11*a* corresponding to the on-chip lens 11*b*.

In the semiconductor chip 10 configured as described above, light incident through lenses (not shown) and the lens 16 enters the light-receiving surface of the laminated substrate 11*a* through the glass substrate 14, the adhesive 12, and the on-chip lens 11*b*, and charges corresponding to the light are accumulated whereby imaging is performed.

<Method for Manufacturing Integrated Portion>

Figure 2:
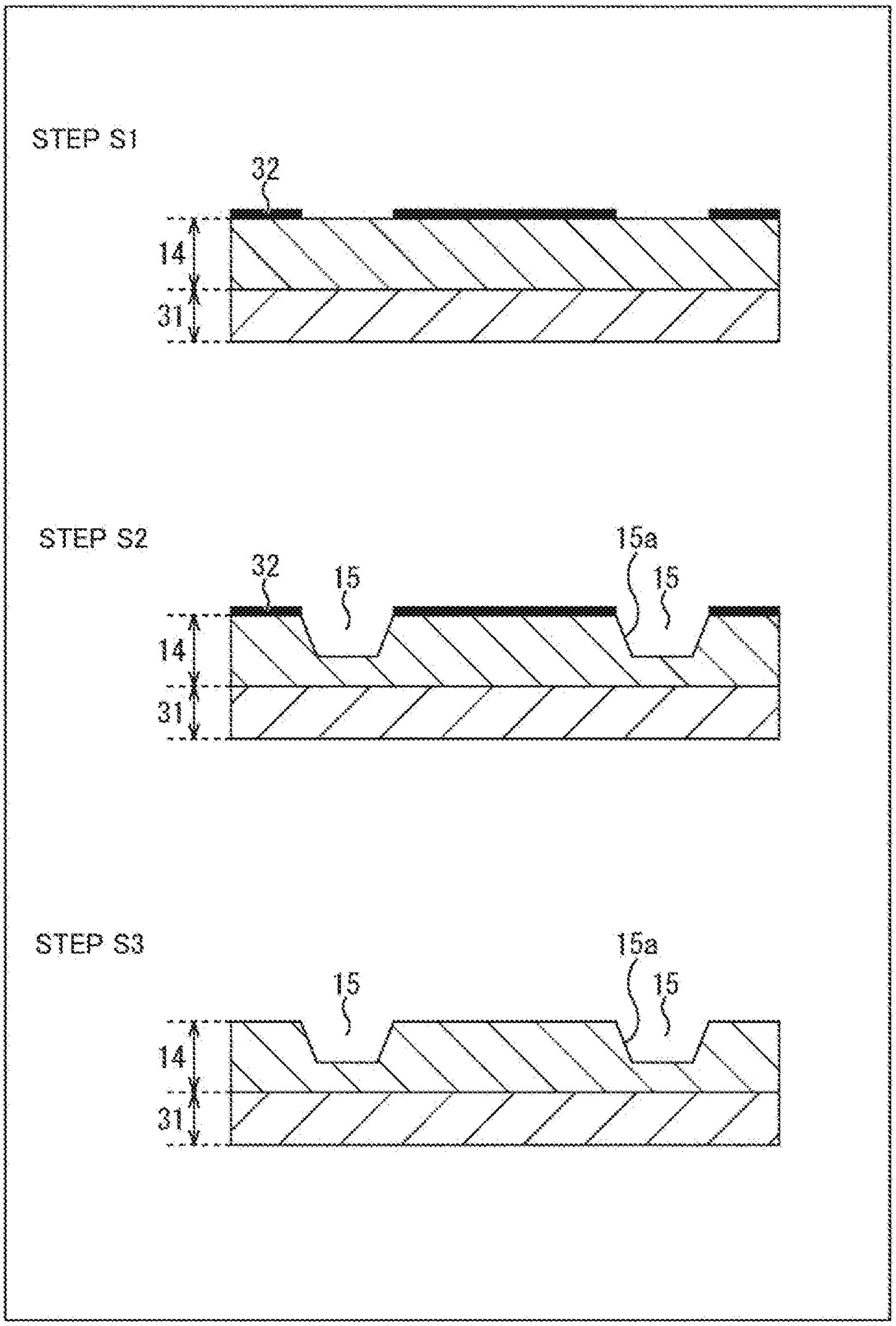
FIG. 2 is a diagram for explaining a method for manufacturing an integrated portion of FIG. 1.
Figure 3:
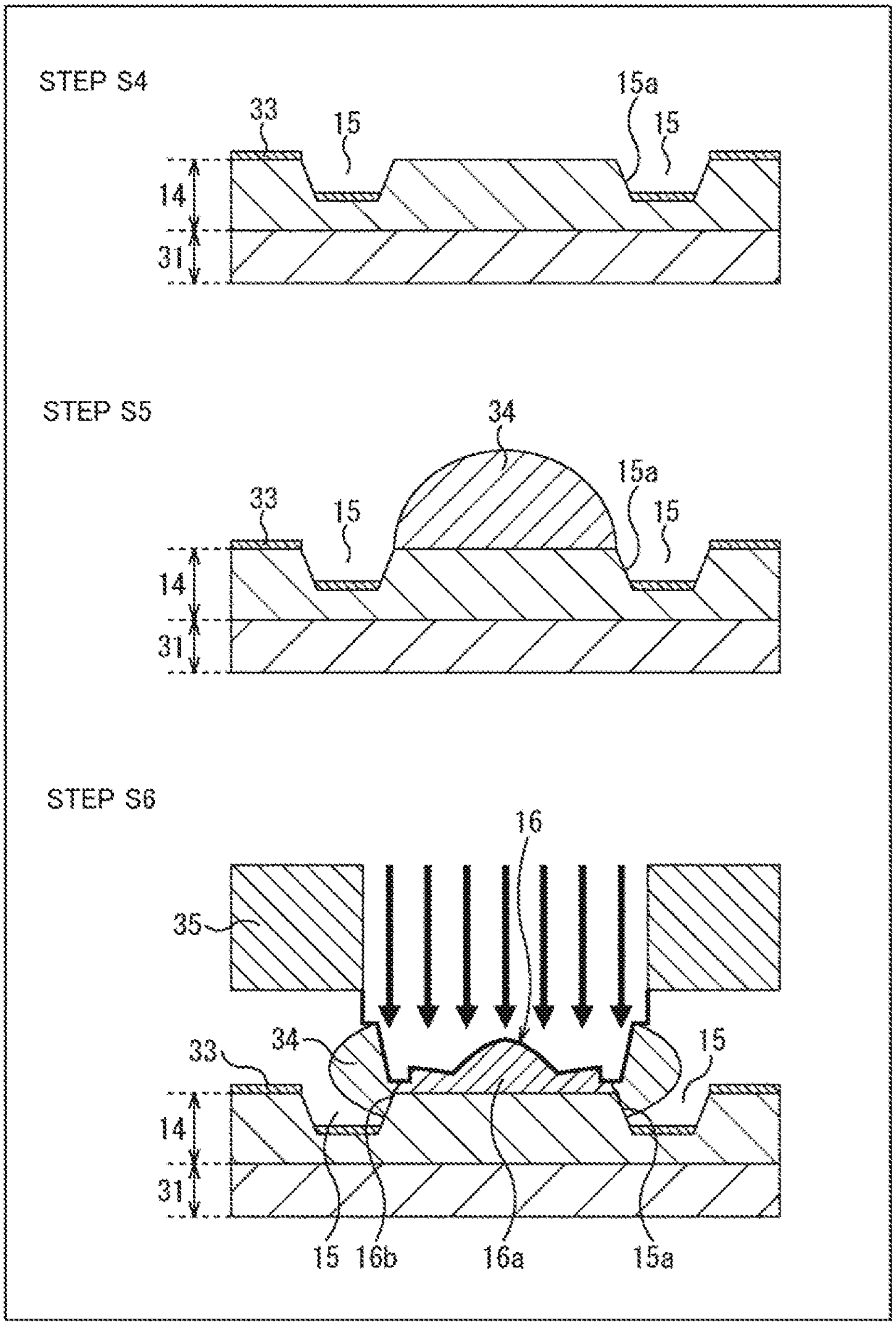
FIG. 3 is a diagram for explaining a method for manufacturing the integrated portion of FIG. 1.
Figure 4:
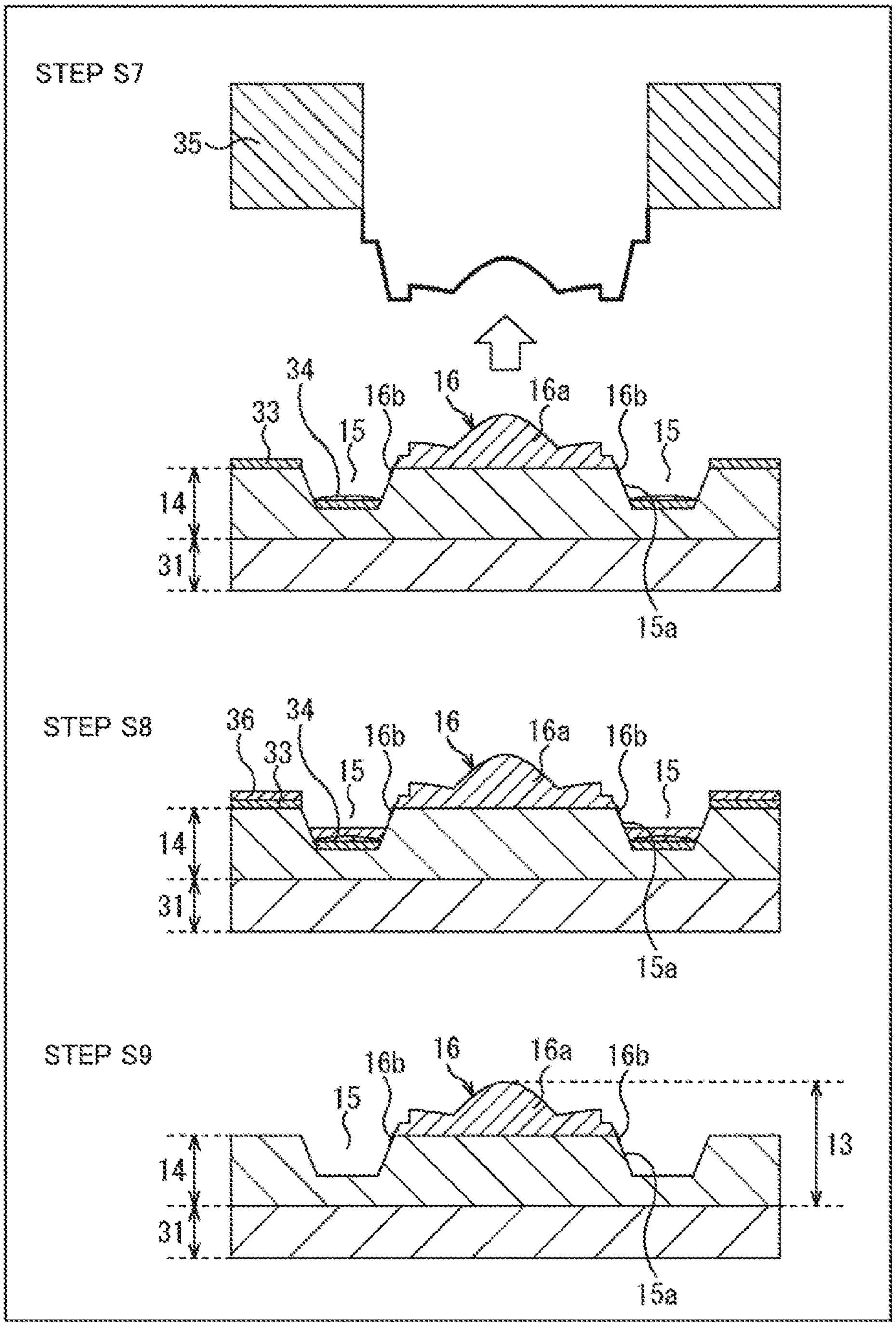
FIG. 4 is a view for explaining a method for manufacturing the integrated portion of FIG. 1.

FIGS. 2 to 4 are diagrams for explaining the method for manufacturing the integrated portion 13 of FIG. 1.

As shown in FIG. 2, in step S1, the glass substrate 14 is provided on a chuck 31, and a resist 32 is patterned. Specifically, the resist 32 is applied to a region other than the region on the glass substrate 14 where the groove 15 is formed.

In step S2, etching such as wet etching or dry etching is performed on the glass substrate 14 applied with the resist 32 in step S1, and the region of the glass substrate 14 not applied with the resist 32 is etched in the vertical direction. As a result, the groove 15 is formed around the region of the glass substrate 14 where the lens 16 is formed. At this time, the side surfaces 15*a* of the groove 15 are ideally perpendicular to the glass substrate 14, but actually, the bottom surface of the groove 15 is smaller than the upper surface, and the side surfaces 15*a* are inclined. In step S3, the resist 32 is removed.

In step S4 of FIG. 3, a water-repellent film 33 having a thickness of several nanometers, for example, thinner than the height L1–L2 of the groove 15 is patterned on a region of the glass substrate 14 having the grooves 15 formed thereon, where the lenses 16 are not formed. In step S5, a lens resin 34, which is a photocurable resin, is applied to the region on the glass substrate 14 where the lens 16 is formed. At this time, since the water-repellent film 33 is formed in the region where the lens 16 is not formed, the lens resin 34 is suppressed from diffusing into the region where the lens 16 is not formed, that is, the region where the lens resin 34 is unnecessary. As a result, the amount of the lens resin 34 required to form the lens 16 can be reduced. Moreover, variations in the shape of the lens 16 can be suppressed.

In step S6, a mold 35 with a light-shielding mask having a shape corresponding to the shape of the main portion 16*a* of the lens 16 is pressed (imprinted) against the lens resin 34, and the lens resin 34 is irradiated with light through the mold 35, whereby the lens resin 34 is exposed. As a result, the exposed lens resin 34 having a shape corresponding to the shape of the main portion 16*a* is cured, and the lens 16 is molded. That is, the lens 16 having a substantially desired shape is formed in the region on the glass substrate 14 where the lens 16 is formed. On the other hand, the lens resin 34 at which light from the mold 35 does not arrive and which is not exposed is not cured.

In step S7 of FIG. 4, the lens 16 is released from the mold 35. In step S8, a cleaning liquid 36 is injected onto the glass substrate 14 to perform a cleaning treatment. In step S9, the water-repellent film 33 and the uncured (unexposed) lens resin 34 are removed together with the cleaning liquid 36, and the integrated portion 13 is manufactured.

The integrated portion 13 manufactured as described above is bonded to the solid-state imaging element 11 via the adhesive 12, whereby the semiconductor chip 10 is manufactured.

<Description of Groove>

Figure 5:
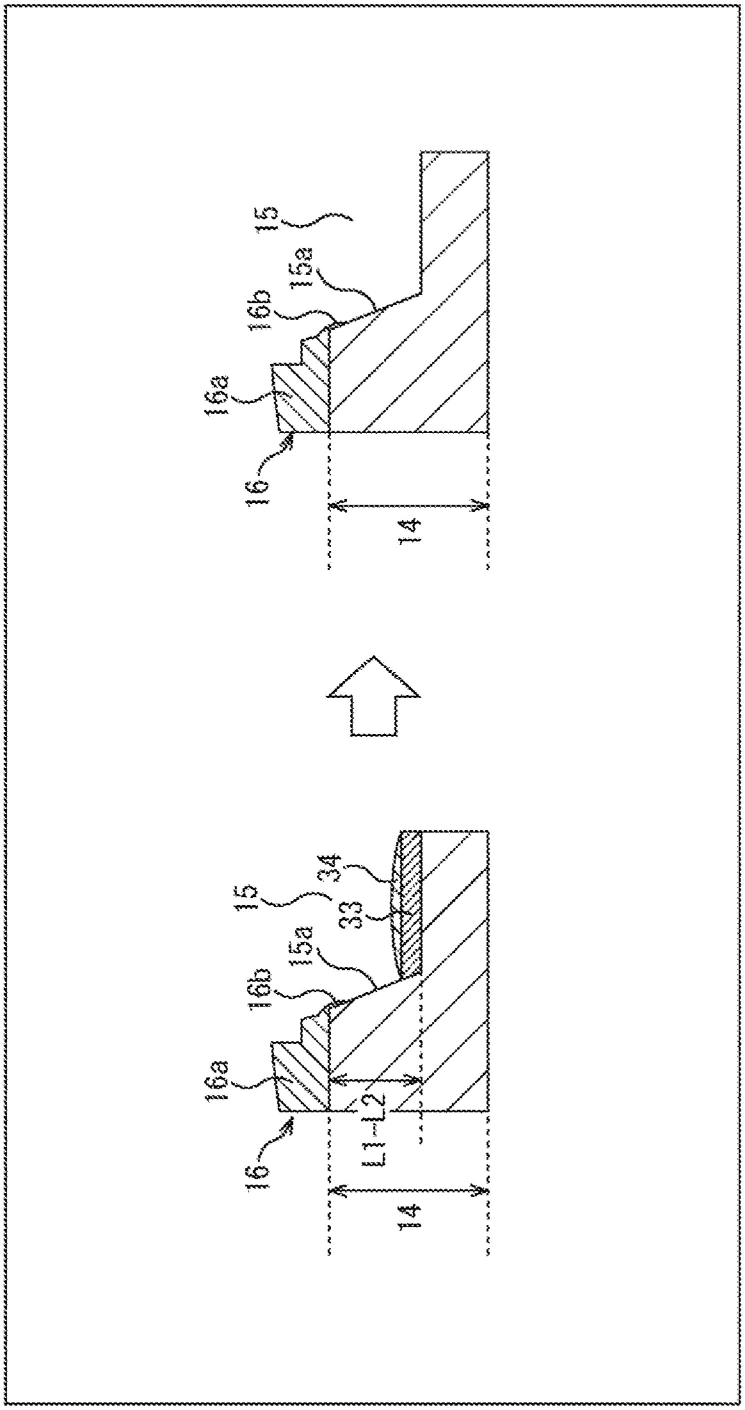
FIG. 5 is a cross-sectional view of the region around the groove in steps S7 and S9.

FIG. 5 is a cross-sectional view of the region around the groove 15 in steps S7 and S9 of FIG. 4.

As shown on the left side of FIG. 5, when the lens 16 is released from the mold 35 in step S7 of FIG. 4, the hemming portion 16*b* of the lens 16 is formed along the side surface 15*a* on the lens 16 side of the groove 15 from the upper surface of the glass substrate 14.

Specifically, since there is a step of the distance L1–L2 between the upper surface of the glass substrate 14 on which the lens 16 is formed and the bottom surface of the groove 15, the lens resin 34 extruded from above the glass substrate 14 by the pressing of the mold 35 in step S6 of FIG. 3 falls onto the water repellent film 33 on the bottom surface of the groove 15 along the side surface 15*a*. The region of the extruded lens resin 34 around the mold 35, that is, the region around the main portion 16*a* is unintentionally exposed to light due to refraction of light incident through the mold 35 and cured to form the hemming portion 16*b*. Therefore, the hemming portion 16*b* is formed along the side surface 15*a* from the upper surface of the glass substrate 14.

However, since the hemming portion 16*b* is formed only around the main portion 16*a*, that is, near the upper surface of the glass substrate 14, the hemming portion 16*b* does not come into contact with the water repellent film 33 applied to the bottom surface of the groove 15 at a position lower than the upper surface of the glass substrate 14 by L1–L2. Therefore, as shown on the right side of FIG. 5, when the water-repellent film 33 and the uncured lens resin 34 are removed together with the cleaning liquid 36 in step S9 of FIG. 4, the hemming portion 16*b* does not peel off together with the water-repellent film 33 and the uncured lens resin 34.

Moreover, since the hemming portion 16*b* is ideally formed in a vertical direction along the side surface 15*a* from the upper surface of the glass substrate 14, the adhesion force between the lens 16 and the glass substrate 14 is improved, and peeling of the lens 16 from the glass substrate 14, that is, so-called lens peel-off, can be suppressed.

<Description of State of Hemming Portion>

Figure 6A:
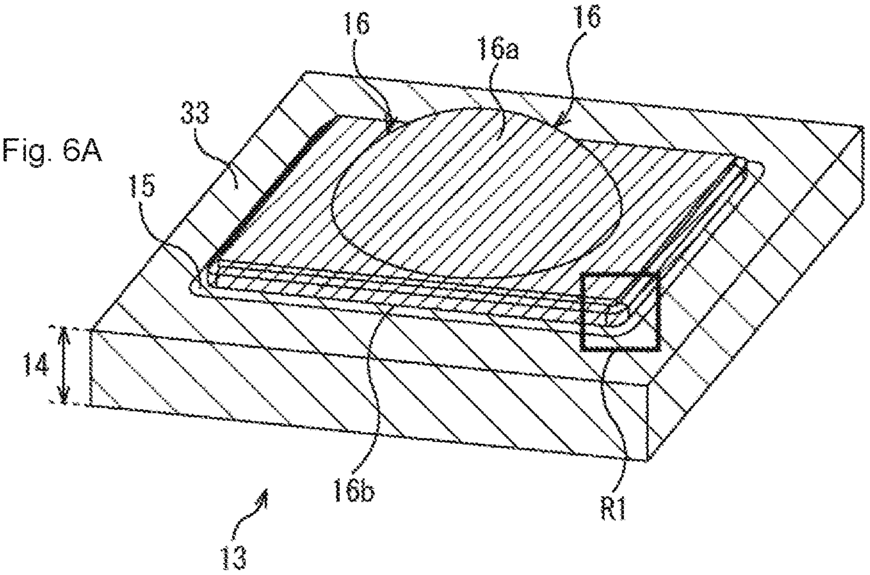
FIGS. 6A and 6B are diagrams for explaining the state of a hemming portion of FIG. 1.
Figure 6B:
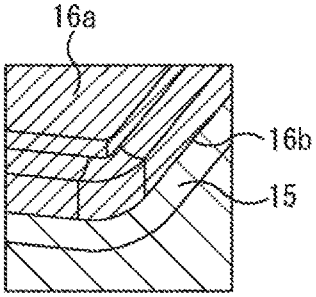

FIGS. 6A and 6B are diagrams illustrating the state of the hemming portion 16*b*.

FIG. 6A shows a perspective view of the entire integrated portion 13, and FIG. 6B is an enlarged view of the rectangle R1 in FIG. 6A.

As shown in FIG. 6A, the groove 15 is formed along the outer periphery of the lens 16. Therefore, the hemming portion 16*b* does not peel off together with the water-repellent film 33 and the uncured lens resin 34 as described above. Therefore, as shown in FIGS. 6A and 6B, cracks due to a portion of the hemming portion 16*b* peeling off (floating) from the glass substrate 14 do not occur in the hemming portion 16*b*. As a result, it is possible to prevent decrease in the adhesion force between the glass substrate 14 and the lens 16 due to the cracks, thereby suppressing the occurrence of the lens peel-off.

<Description of Integrated Portion when there is No Groove>

Figure 7A:
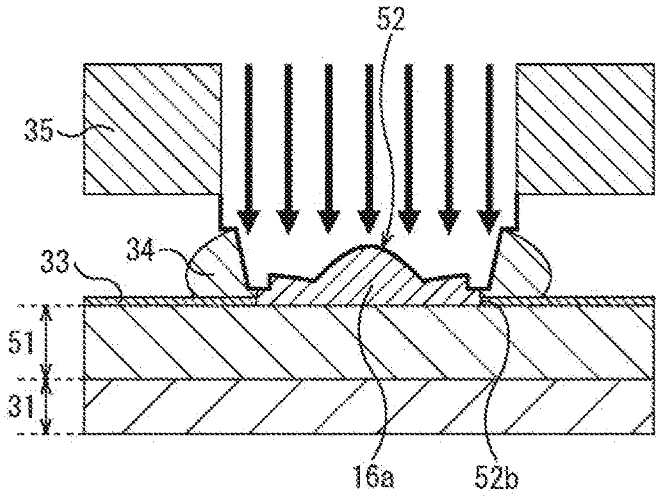
FIGS. 7A and 7B are diagrams for explaining the molding of the lens in the integrated portion when there is no groove.
Figure 7B:
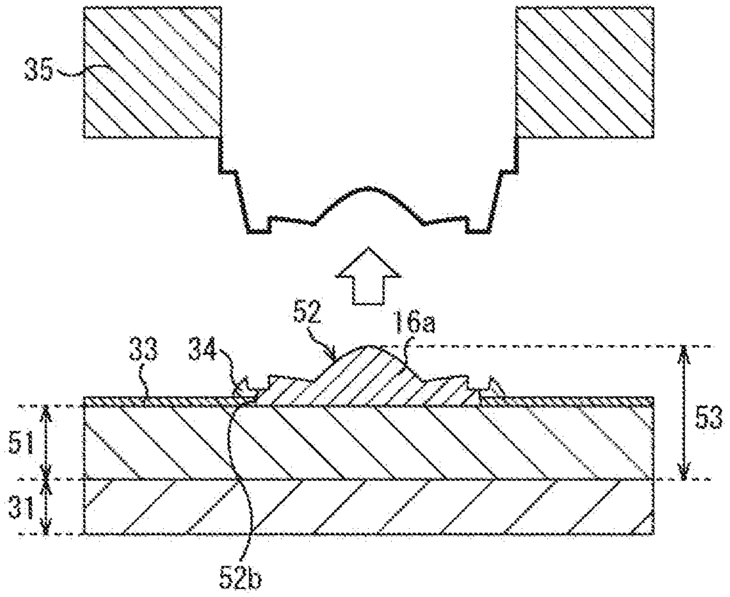

FIGS. 7A and 7B are diagrams for explaining the molding of the lens in the integrated portion when the groove 15 is not provided.

That is, FIG. 7A corresponds to step S6 in FIG. 3, and FIG. 7B corresponds to step S7 in FIG. 4. In FIGS. 7A and 7B, the same portions as those in FIG. 3 are denoted by the same reference numerals, and the redundant description thereof will be omitted as appropriate.

As shown in FIG. 7A, when there is no groove 15 in the integrated portion 13, the lens resin 34 applied to the region on the glass substrate 51 without the groove 15 where the water-repellent film 33 is not formed is exposed to light using the mold 35, whereby a lens 52 is molded. At this time, the lens resin 34 at which light from the mold 35 does not arrive and which is not exposed is not cured. The lens 52 is different from the lens 16 in that it has a hemming portion **52*b* instead of the hemming portion 16*b*, and the other configuration is the same as that of the lens 16**.

As shown in FIG. 7B, when the lens 52 is released from the mold 35, the hemming portion **52*b* unintentionally cured due to refraction of light from the mold 35 as well as the main portion 16*a* of the lens 52 are formed on the glass substrate 14, and the hemming portion 52*b* comes into contact with the water-repellent film 33**.

Specifically, the water repellent film 33 suppresses the leakage of the lens resin 34 to the region where the lens 52 is not formed, but it is difficult to control the shape of the end portion of the lens 52 with high accuracy due to refraction of light from the mold 35. Therefore, although the hemming portion **52*b* is unintentionally formed in a region other than the main portion 16*a* when the lens 52 is molded, since the no groove 15 is formed in the glass substrate 51, the hemming portion 52*b* and the water repellent film 33 make contact with each other on the same glass substrate 14. Thereafter, when a cleaning treatment is performed and the water-repellent film 33 and the uncured lens resin 34 thereon are removed, a portion of the hemming portion 52*b* peels off together with the water-repellent film 33 and the uncured lens resin 34**.

Figure 8A:
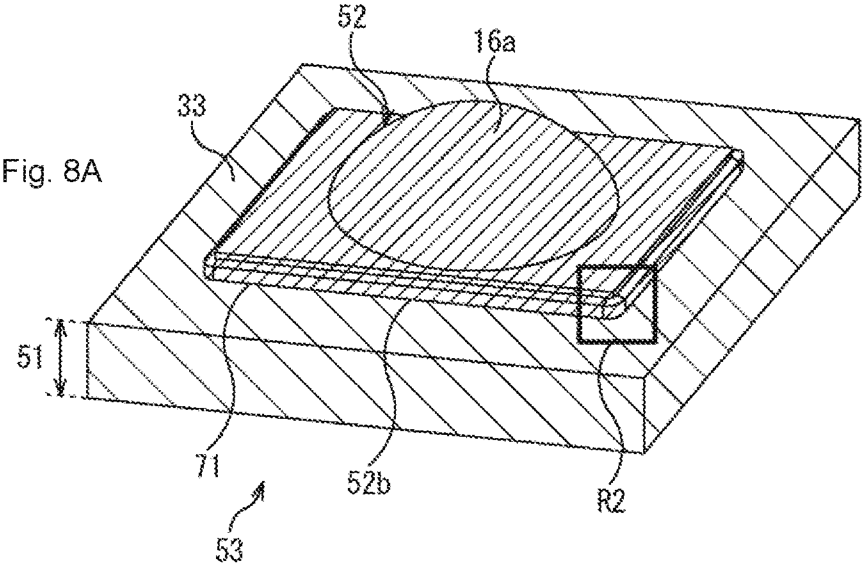
FIGS. 8A and 8B are perspective views of the integrated portion when there is no groove.
Figure 8B:
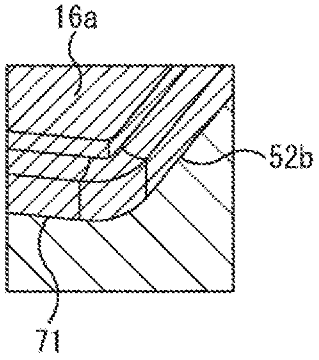

FIGS. 8A and 8B are perspective views of the integrated portion when the lens 52 is molded as described above. FIG. 8A is a perspective view of the entire integrated portion, and FIG. 8B is an enlarged view of the rectangle R2 in FIG. 8A.

As shown in FIGS. 8A and 8B, since the groove 15 is not formed in the glass substrate 51 in the integrated portion 53, a portion of the hemming portion **52*b* peels off together with the water repellent film 33 and the uncured lens resin 34 as described above. Therefore, as shown in FIGS. 8A and 8B, cracks 71 may occur in the hemming portion 52*b* due to a portion of the hemming portion 52*b* peeling off from the glass substrate 14**.

Figure 9A:
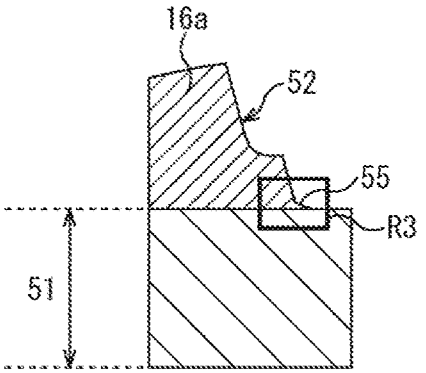
FIGS. 9A and 9B are cross-sectional views of the periphery of an ideal hemming portion in the integrated portion of FIGS. 8A and 8B.
Figure 9B:
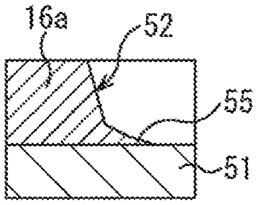
Figures 10A, 10B:
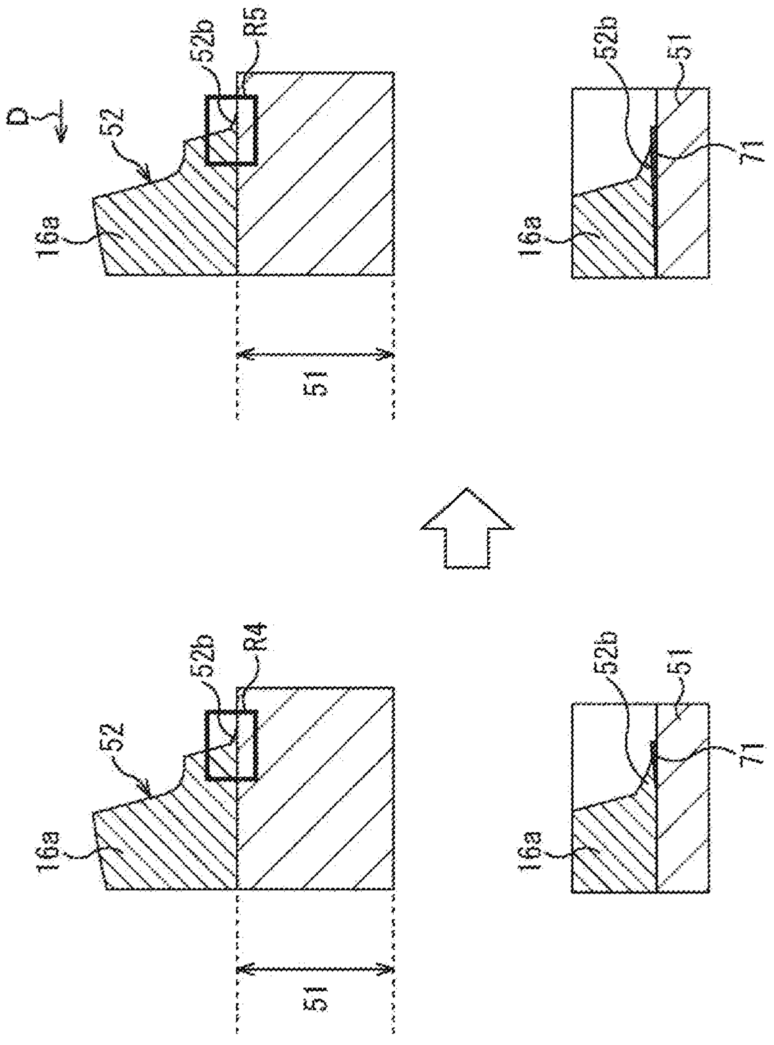
FIGS. 10A and 10B are cross-sectional views of the periphery of an actual hemming portion in the integrated portion of FIGS. 8A and 8B.

FIGS. 9A and 9B are cross-sectional views of the periphery of an ideal hemming portion in the integrated portion 53, and FIGS. 10A and 10B are cross-sectional views of the periphery of an actual hemming portion **52*b*. FIG. 9A is a cross-sectional view of the entire periphery of an ideal hemming portion, and FIG. 9B is an enlarged view of the rectangle R3 in FIG. 9A. FIG. 10A is a cross-sectional view of the entire periphery of the actual hemming portion 52*b*. The left side of FIG. 10B is an enlarged view of the rectangle R4 in FIG. 10A, and the right side of FIG. 10B is an enlarged view of the rectangle R5 in FIG. 10**A.

As shown in FIGS. 9A and 9B, the ideal hemming portion 55 of the lens 52 has no cracks and has high adhesion force to the glass substrate 51. However, as shown on the left side of FIG. 10B, cracks 71 may occur in the actual hemming portion **52*b* as described above. In this case, the cracks 71 reduce the adhesion force between the lens 52 and the glass substrate 51. Therefore, when the lens 52 receives a force in the direction of arrow D, for example, as shown on the right side of FIG. 10A, the crack 71 in the hemming portion 52*b* may spread as shown on the right side of FIG. 10B, and peeling of the lens 52 from the glass substrate 51**, that is, so-called lens peel-off, may occur.

<Second Configuration Example of Integrated Portion>

Figure 11A:
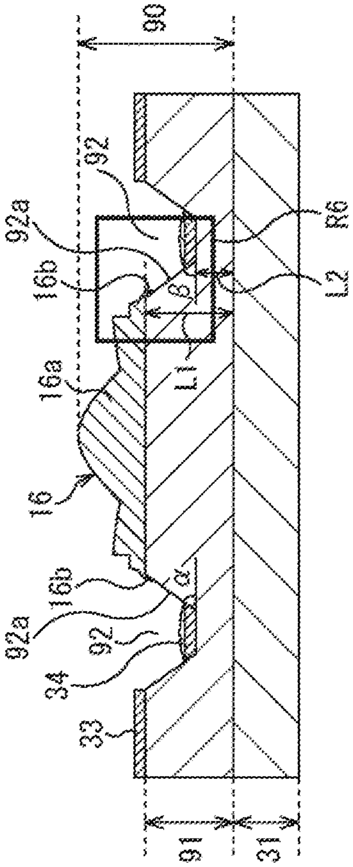
FIGS. 11A and 11B are cross-sectional views showing a second configuration example of the integrated portion in the first embodiment of the semiconductor chip to which the present technology is applied.
Figure 11B:
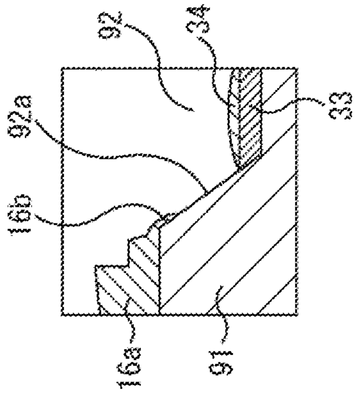

FIGS. 11A and 11B are cross-sectional views showing a second configuration example of the integrated portion in the first embodiment of the semiconductor chip to which the present technology is applied, and is a cross-sectional view showing the integrated portion in a step corresponding to step S7 in FIG. 4.

FIG. 11A is a cross-sectional view of the entire integrated portion 90, and FIG. 11B is an enlarged view of the rectangle R6 in FIG. 11A. In the integrated portion 90 of FIGS. 11A and 11B, portions corresponding to those of the integrated portion 13 of FIGS. 1 and 4 are denoted by the same reference numerals. Therefore, description of the corresponding portions will be omitted as appropriate, and the description will focus on the portions different from the integrated portion 13.

The integrated portion 90 of FIGS. 11A and 11B are different from the integrated portion 13 in that a glass substrate 91 is provided in place of the glass substrate 14, and the other configuration is the same as that of the integrated portion 13. The glass substrate 91 is different from the glass substrate 14 in that a groove 92 is provided instead of the groove 15, and the other configuration is the same as that of the glass substrate 14.

The groove 92 is different from the groove 15 in that the side surface **92*a* of the groove 92 is an inclined surface having a predetermined inclination, and the other configuration is the same as that of the groove 15. In FIGS. 11A and 11B, the angle of the side surface 92*a* on the lens 16 side on the left side of the groove 92 with respect to the horizontal direction is $\alpha$ ($0° < \alpha < 90°$), and the angle of the side surface 92*a* on the lens 16 side on the right side of the groove 92** with respect to the horizontal direction is $\beta$ ($0° < \beta < 90°$). The angles $\alpha$ and $\beta$ may be the same or different.

Like the groove 15, the groove 92 has a bottom surface at a position lower than the upper surface of the glass substrate 14 by L1-L2. Therefore, as shown in FIGS. 11A and 11B, the hemming portion **16*b* does not come into contact with the water-repellent film 33 applied on the bottom surface. Therefore, cracks do not occur in the hemming portion 16*b***, and lens peel-off can be suppressed.

In addition, since the side surface **92*a* of the groove 92 is an inclined surface, the adhesion area of the hemming portion 16*b* with respect to the side surface 92*a* is increased compared to the case where the side surface 92*a* is a vertical surface. Therefore, the adhesion force between the side surface 92*a* and the hemming portion 16*b*** is improved, and as a result, the occurrence of lens peel-off can be further suppressed.

<Third Configuration Example of Integrated Portion>

Figure 12A:
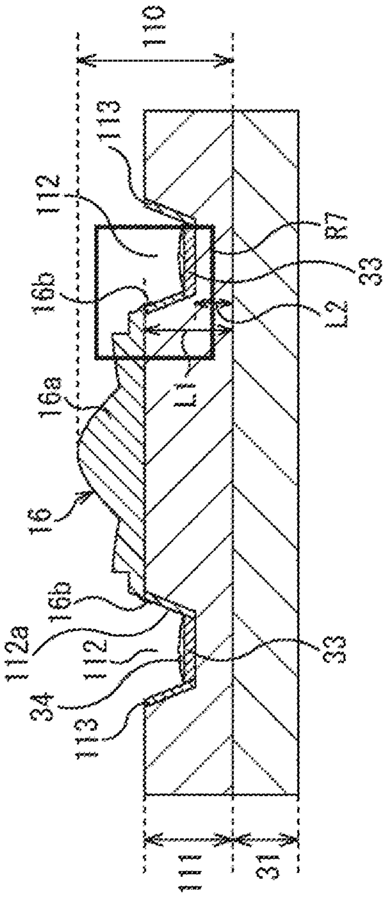
FIGS. 12A and 12B are cross-sectional views showing a third configuration example of the integrated portion in the first embodiment of the semiconductor chip to which the present technology is applied.
Figure 12B:
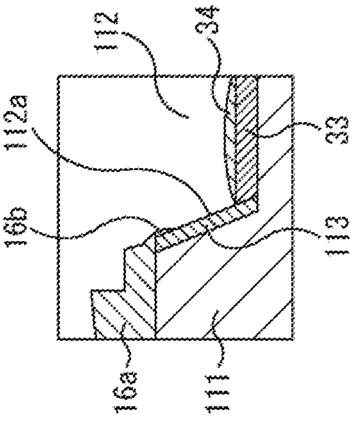

FIGS. 12A and 12B are cross-sectional views showing a third configuration example of the integrated portion in the first embodiment of the semiconductor chip to which the present technology is applied, and is a cross-sectional view showing the integrated portion in a step corresponding to step S7 in FIG. 4.

FIG. 12A is a cross-sectional view of the entire integrated portion 110, and FIG. 12B is an enlarged view of the rectangle R7 in FIG. 12A. In the integrated portion 110 of FIGS. 12A and 12B, portions corresponding to those of the integrated portion 13 of FIGS. 1 and 4 are denoted by the same reference numerals. Therefore, description of the corresponding portions will be omitted as appropriate, and the description will focus on the portions different from the integrated portion 13.

The integrated portion 110 of FIGS. 12A and 12B are different from the integrated portion 13 in that a glass substrate 111 is provided in place of the glass substrate 14, and the other configuration is the same as that of the integrated portion 13. The glass substrate 111 is different from the glass substrate 14 in that a groove 112 is provided instead of the groove 15, and the other configuration is the same as that of the glass substrate 14.

The groove 112 is different from the groove 15 in that the side surfaces 112*a* are satin-finished to prevent regular reflection of light, and the other configuration is the same as that of the groove 15. That is, the groove 112 has an uneven surface 113 on the surface of the side surface 112*a*.

Like the groove 15, the groove 112 has a bottom surface at a position lower than the upper surface of the glass substrate 14 by L1-L2. Therefore, as shown in FIGS. 12A and 12B, the hemming portion 16*b* does not come into contact the water-repellent film 33 applied on the bottom surface. Therefore, cracks do not occur in the hemming portion 16*b*, and lens peel-off can be suppressed.

Further, since the uneven surface 113 is provided on the surface of the side surface 112*a* of the groove 112, the light incident from the mold 35 and leaking out from the mold 35 during molding of the lens 16 is irregularly reflected by the uneven surface 113. As a result, the formation of the hemming portion 16*b* due to the leaking light can be suppressed.

The processing applied to the side surface 112*a* may be processing other than the satin finish, as long as the processing prevents regular reflection of light.

<Fourth Configuration Example of Integrated Portion>

FIG. 13 is a cross-sectional view showing a fourth configuration example of the integrated portion in the first embodiment of the semiconductor chip to which the present technology is applied, and is a cross-sectional view showing the integrated portion in a step corresponding to step S7 in FIG. 4.

<Fourth Configuration Example of Integrated Portion>

Figure 13A:
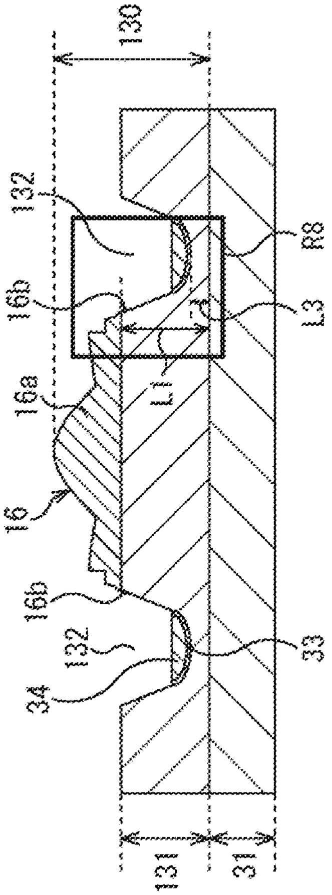
FIGS. 13A and 13B are cross-sectional views showing a fourth configuration example of the integrated portion in the first embodiment of the semiconductor chip to which the present technology is applied.
Figure 13B:
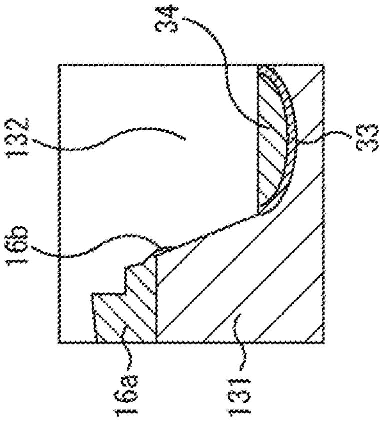

FIGS. 13A and 13B are cross-sectional views showing a fourth configuration example of the integrated portion in the first embodiment of the semiconductor chip to which the present technology is applied, and is a cross-sectional view showing the integrated portion in a step corresponding to step S7 in FIG. 4.

FIG. 13A is a cross-sectional view of the entire integrated portion 130, and FIG. 13B is an enlarged view of the rectangle R8 in FIG. 13A. In the integrated portion 130 of FIGS. 13A and 13B, portions corresponding to those of the integrated portion 13 of FIGS. 1 and 4 are denoted by the same reference numerals. Therefore, description of the corresponding portions will be omitted as appropriate, and the description will focus on the portions different from the integrated portion 13.

The integrated portion 130 of FIGS. 13A and 13B are different from the integrated portion 13 in that a glass substrate 131 is provided instead of the glass substrate 14, and the other configuration is the same as that of the integrated portion 13. The glass substrate 131 is different from the glass substrate 14 in that a groove 132 is provided instead of the groove 15, and the other configuration is the same as that of the glass substrate 14.

The groove 132 is different from the groove 15 in that the bottom surface is curved and the thickness at the lowest position of the bottom surface is L3 (L1>L3), and the other configuration is the same as that of the groove 15.

In the groove 132, the lowest position of the bottom surface is at the position lower than the upper surface of the glass substrate 14 by L1-L3. Therefore, like the groove 15, as shown in FIGS. 13A and 13B, the hemming portion 16*b* does not come into contact with the water-repellent film 33 applied to the bottom surface. Therefore, cracks do not occur in the hemming portion 16*b*, and lens peel-off can be suppressed.

Further, since the bottom surface of the groove 132 is curved, the water repellent film 33 and the uncured lens resin 34 can be easily removed together with the cleaning liquid 36 after the cleaning treatment.

As described above, the semiconductor chip 10 includes the solid-state imaging element 11, the glass substrate 14 (91, 111, 131) provided on the solid-state imaging element 11, and the lens 16 formed on the glass substrate 14 (91, 111, 131). The glass substrate 14 has a groove 15 (92, 112, 132) around the region where the lens 16 is formed.

Therefore, the water-repellent film 33 and the hemming portion 16*b* do not come into contact when the lens 16 is formed. As a result, when the water repellent film 33 and the uncured lens resin 34 are removed together with the cleaning liquid 36, it is possible to prevent a portion of the hemming portion 16*b* from peeling off together with them, thereby preventing cracks from occurring in the hemming portion 16*b*. Therefore, it is possible to suppress the peeling of the lens 16 from the glass substrate 14 (91, 111, 131) due to the cracks. As a result, reliability and durability of the semiconductor chip 10 can be improved.

Although illustration is omitted, the method for manufacturing the integrated portion 90 (110, 130) is the same as the method for manufacturing the integrated portion 13 described with reference to FIGS. 2 to 4. In addition, in the method for manufacturing the integrated portion 13 (90, 11, 130), the water-repellent film 33 may not be formed.

Second Embodiment

<Configuration Example of Semiconductor Chip>

Figure 14A:
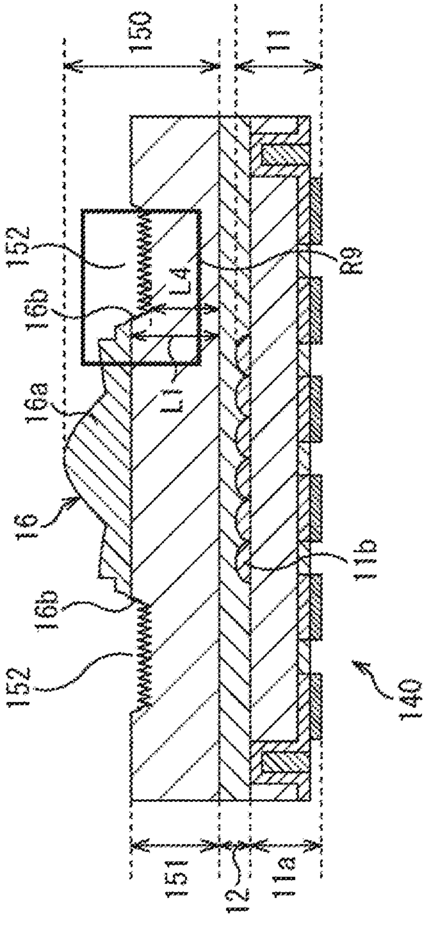
FIGS. 14A and 14B are cross-sectional views showing a configuration example of a second embodiment of a semiconductor chip to which the present technology is applied.
Figure 14B:
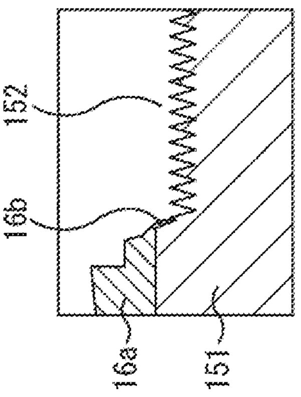

FIGS. 14A and 14B are cross-sectional views showing a configuration example of a second embodiment of a semiconductor chip to which the present technology is applied.

FIG. 14A is a cross-sectional view of an entire semiconductor chip 140, and FIG. 14B is an enlarged view of the rectangle R9 in FIG. 14A. In the semiconductor chip 140 of FIGS. 14A and 14B, the portions corresponding to those of the semiconductor chip 10 of FIG. 1 are denoted by the same reference numerals. Therefore, description of the corresponding portions will be omitted as appropriate, and the description will focus on the portions different from the semiconductor chip 10.

The semiconductor chip 140 of FIGS. 14A and 14B are different from the semiconductor chip 10 in that an integrated portion 150 is provided instead of the integrated portion 13, and the other configuration is the same as that of the semiconductor chip 10. The integrated portion 150 is different from the integrated portion 13 in that a glass substrate 151 is provided in place of the glass substrate 14, and the other configuration is the same as that of the integrated portion 13. The glass substrate 151 is different from the glass substrate 14 in that a groove 152 is provided instead of the groove 15, and the other configuration is the same as that of the glass substrate 14.

The groove 152 is different from the groove 15 in that the bottom surface of the groove 152 is processed to a sawtooth cross-sectional shape as processing to increase the surface area of the bottom surface compared to the case where the bottom surface of the groove 152 is flat, and the thickness at the lowest position of the bottom surface is L4 (L4>L2), and the other configuration is the same as that of the groove 15. It should be noted that L1−L4 is so small that the hemming portion 16*b* comes into contact with the bottom surface of the groove 15.

The bottom surface of the groove 152 makes contact with the hemming portion 16*b*, but the cross-sectional shape of the bottom surface of the groove 152 has a sawtooth shape, and the surface area of the bottom surface of the groove 152 is larger than when the bottom surface is flat. Therefore, the adhesion force between the bottom surface of the groove 152 and the hemming portion 16*b* is greater than when the bottom surface of the groove 152 is flat.

The processing performed on the bottom surface of the groove 152 may be any processing that increases the surface area compared to the case where the bottom surface is flat, that is, processing that makes the bottom surface uneven.

<Method for Manufacturing Integrated Portion>

Figure 15:
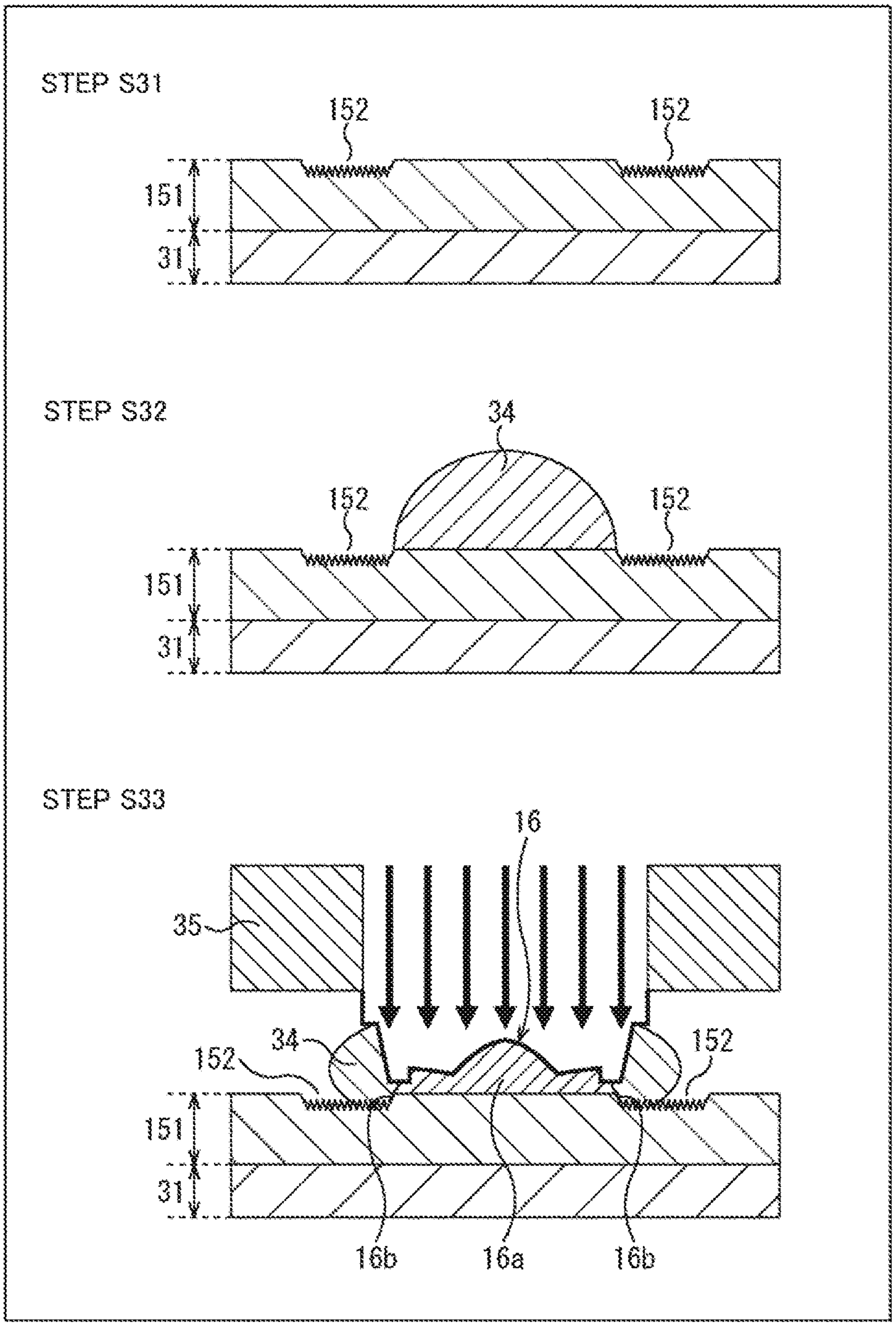
FIG. 15 is a diagram for explaining a method for manufacturing an integrated portion of FIGS. 14A and 14B.
Figure 16:
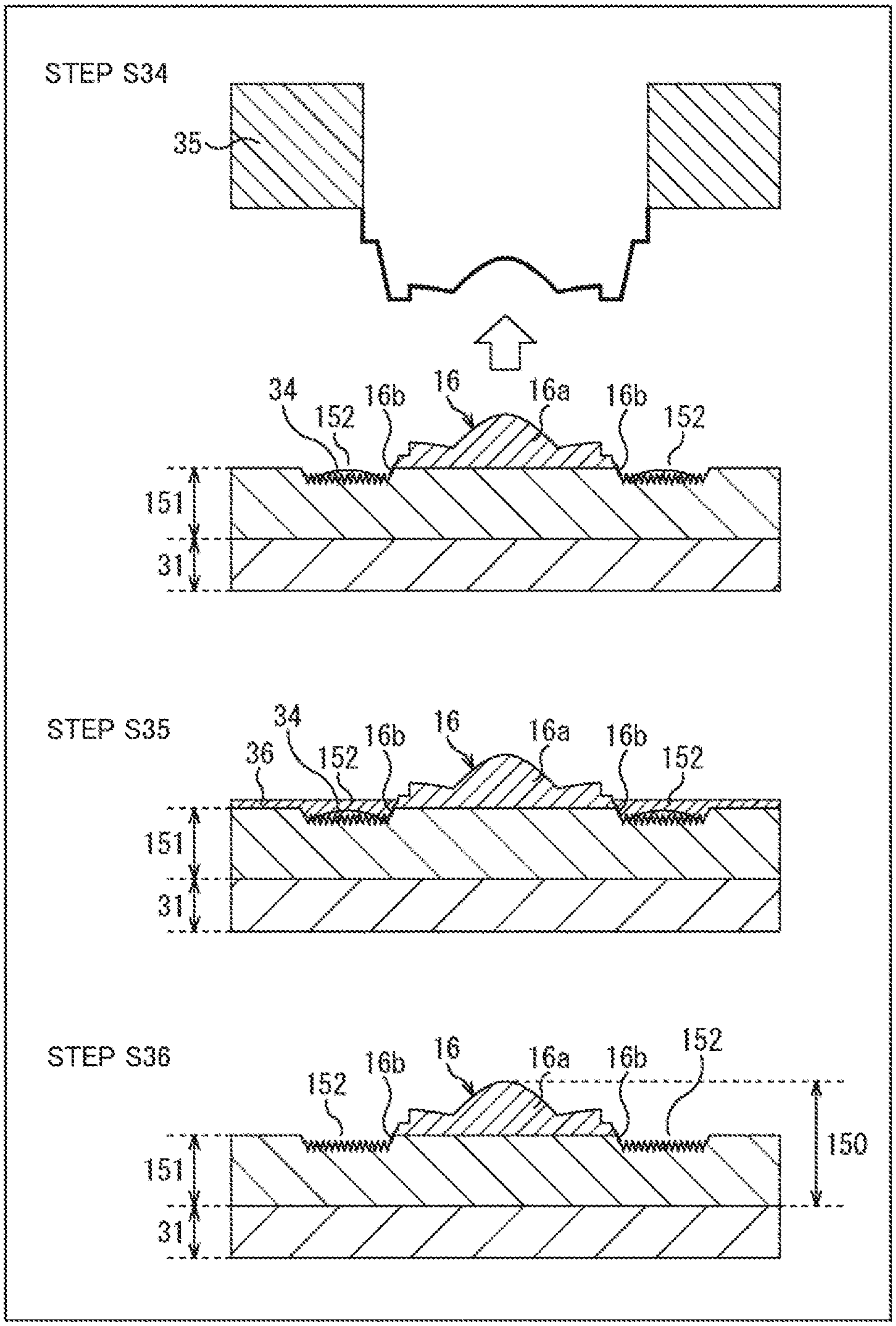
FIG. 16 is a view for explaining a method for manufacturing the integrated portion of FIGS. 14A and 14B.

FIGS. 15 and 16 are diagrams illustrating a method for manufacturing the integrated portion 150 of FIGS. 14A and 14B.

In FIGS. 15 and 16, portions corresponding to those in FIGS. 3 and 4 are denoted by the same reference numerals.

First, steps similar to the processing of steps S1 to S3 in FIG. 2 are performed to form grooves 152 in the glass substrate 151. Next, in step S31 of FIG. 15, the bottom surface of the groove 152 is processed to have a sawtooth cross-sectional shape. In step S32, the lens resin 34 is applied to the region of the glass substrate 151 where the lens 16 is formed.

In step S33, the mold 35 is pressed against the lens resin 34 and the lens resin 34 is irradiated with light through the mold 35, whereby the lens resin 34 is exposed. As a result, the exposed lens resin 34 having a shape corresponding to the shape of the main portion 16*a* is cured, and the lens 16 is molded. That is, the lens 16 having a substantially desired shape is formed in the region on the glass substrate 151 where the lens 16 is formed. On the other hand, the lens resin 34 at which light from the mold 35 does not arrive and which is not exposed is not cured.

In step S34 of FIG. 16, the lens 16 is released from the mold 35. In step S35, the cleaning liquid 36 is injected onto the glass substrate 151 to perform a cleaning treatment. In step S36, the uncured lens resin 34 is removed together with the cleaning liquid 36, and the integrated portion 150 is manufactured.

Here, since the surface area of the bottom surface of the groove 152 is larger than when the bottom surface of the groove 152 is flat, the adhesion force between the bottom surface of the groove 152 and the hemming portion 16*b* is high. Therefore, it is possible to prevent the hemming portion 16*b* from peeling off from the bottom surface of the groove 152 together with the uncured lens resin 34, thereby preventing cracks from occurring in the hemming portion 16*b*.

The integrated portion 150 manufactured as described above is bonded onto the solid-state imaging element 11 via the adhesive 12, whereby the semiconductor chip 140 is manufactured. In addition, in the example of the manufacturing method in FIGS. 15 and 16, the water repellent film is not formed, but the water-repellent film may be formed. In addition, the cleaning liquid 36 may be injected so as to have a thickness such that the cleaning liquid 36 does not come into contact with the hemming portion 16*b*. In this case, it is possible to further suppress the occurrence of peeling of the hemming portion 16*b*.

As described above, the semiconductor chip 140 includes the solid-state imaging element 11, the glass substrate 151 provided on the solid-state imaging element 11, and the lens 16 formed on the glass substrate 151. The glass substrate 151 has the groove 152 around the region where the lens 16 is formed. Further, the bottom surface of the groove 152 is processed to increase the surface area compared to the case where the bottom surface of the groove 152 is flat. Therefore, the adhesion force between the bottom surface of the groove 152 and the hemming portion 16*b* is improved. As a result, when the uncured lens resin 34 is removed together with the cleaning liquid 36, it is possible to prevent the hemming portion 16*b* from peeling off together with the uncured lens resin 34, thereby preventing cracks from occurring in the hemming portion 16*b*. Therefore, it is possible to suppress the peeling of the lens 16 from the glass substrate 151 due to the cracks. As a result, reliability and durability of the semiconductor chip 140 can be improved.

In the first embodiment and the second embodiment, the solid-state imaging element 11 and the integrated portion 13 (90, 110, 130, 150) are manufactured separately, and the integrated portion 13 (90, 110, 130, 150) is bonded to the solid-state imaging element 11 after manufacturing the integrated portion 13 (90, 110, 130, 150) to manufacture the semiconductor chip 10 (140). However, after the solid-state imaging element 11 is formed, the integrated portion 13 (90, 110, 130, 150) may be formed on the solid-state imaging element 11. In this case, when the integrated portion 13 (90, 110, 130, 150) is manufactured, the solid-state imaging element 11 to which the glass substrate 14 (91, 111, 131, 151) is bonded via the adhesive 12 is installed on the chuck 31.

In addition, the features of the grooves 15 (92, 112, 132, 152) of the first embodiment and the second embodiment may be combined. For example, the grooves 112, 132, and 152 may have inclined side surfaces similarly to the groove 92. In addition, the grooves 132 and 152 may have the uneven surfaces 113 on the side surfaces, similarly to the groove 92.

Third Embodiment

<Configuration Example of Semiconductor Chip>

Figure 17:
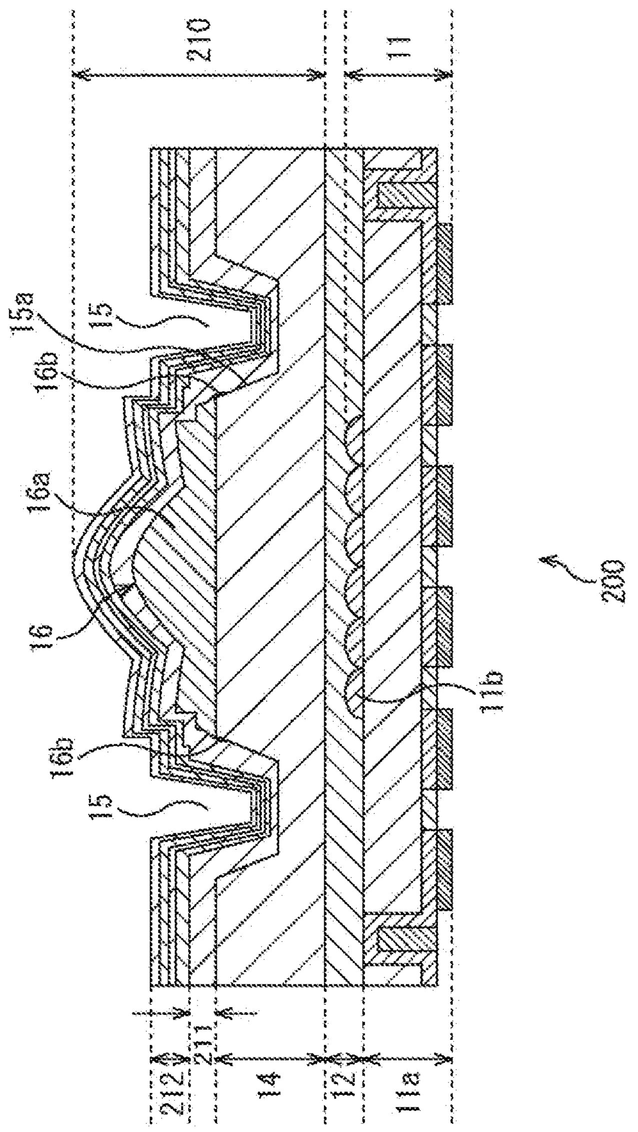
FIG. 17 is a cross-sectional view showing a configuration example of a third embodiment of a semiconductor chip to which the present technology is applied.

FIG. 17 is a cross-sectional view showing a configuration example of a third embodiment of a semiconductor chip to which the present technology is applied.

In a semiconductor chip 200 of FIG. 17, the portions corresponding to those of the semiconductor chip 10 of FIG. 1 are denoted by the same reference numerals. Therefore, description of the corresponding portions will be omitted as appropriate, and the description will focus on the portions different from the semiconductor chip 10.

The semiconductor chip 200 of FIG. 17 is different from the semiconductor chip 10 in that an integrated portion 210 is provided instead of the integrated portion 13, and the other configuration is the same as that of the semiconductor chip 10. The integrated portion 210 is different from the integrated portion 13 in that a buffer layer 211 and an AR coating 212 are newly provided, and the other configuration is the same as that of the integrated portion 13.

A buffer layer 211 is formed between the AR coating 212 and the lens 16. The buffer layer 211 covers the side and upper surfaces of the lens 16 and is also formed on regions of the glass substrate 14 where the lens 16 is not formed, including the groove 15. The buffer layer 211 has a refractive index that is low enough not to affect the light incident through the AR coating 212 from the outside when the light is transmitted through the lens 16. For example, the buffer layer 211 has a refractive index that is the same as or slightly higher than that of the lens 16. In addition, the buffer layer 211 is hard enough to suppress deformation of the AR coating. As the buffer layer 211, a film such as SiO2 or SiON can be used.

The AR coating 212 is an anti-reflection film and covers the entire surface of the buffer layer 211. The AR coating 212 has a four-layer structure in which a high-refractive-index film made of at least one of TiOx, TaOx, NbOx, and the like, and a low-refractive-index film made of at least one of SiOx, SiON, and the like, are alternately laminated.

As described above, the semiconductor chip 200 has the buffer layer 211 between the lens 16 and the AR coating 212. As a result, the AR coating 212 can be suppressed from being damaged when a temperature cycle (TC) test, a temperature humidity storage (THS) test, or the like is performed to evaluate the reliability of the semiconductor chip 200.

Specifically, if the buffer layer 211 is not provided between the lens 16 and the AR coating 212, when a temperature cycle test or the like is performed on the semiconductor chip 200, the AR coating 212 may be deformed and damaged due to a thermal stress difference between the lens 16 and the AR coating 212. In addition, if the buffer layer 211 is not provided, when a temperature humidity storage test or the like is performed on the semiconductor chip 200, the lens 16 may absorb moisture and swells and the AR coating 212 may be damaged.

Therefore, in the semiconductor chip 200, the buffer layer 211 is inserted between the lens 16 and the AR coating 212 so as to function as a buffer material, whereby thermal deformation due to the temperature cycle test or the like and intrusion of moisture into the lens 16 due to the temperature humidity storage test or the like are suppressed. As a result, damage to the AR coating 212 is suppressed, and the reliability of the semiconductor chip 200 can be ensured. For example, it is possible to ensure reliability in a temperature cycle test and a temperature humidity storage test for 500 hours or more.

Although the description is omitted, the method for manufacturing the integrated portion 210 is the same as the method for manufacturing the integrated portion of the fourth embodiment, which will be described later.

Fourth Embodiment

<First Configuration Example of Semiconductor Chip>

Figure 18A:
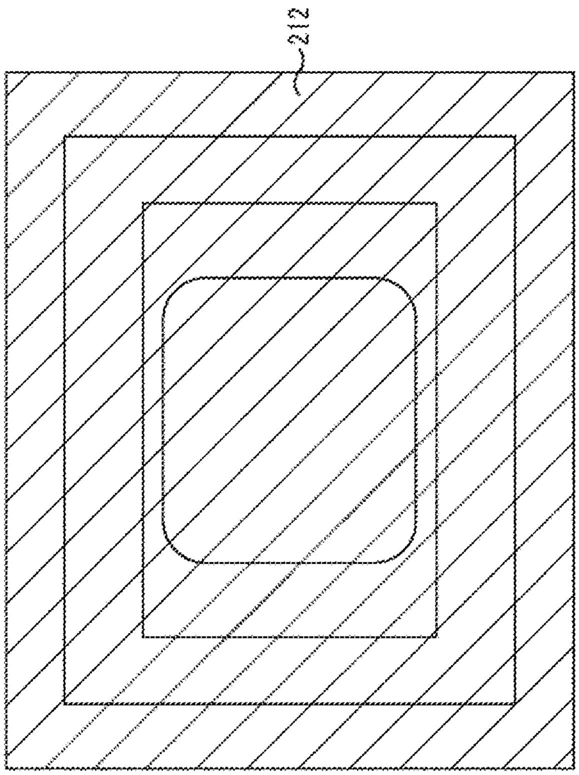
FIGS. 18A and 18B are diagrams showing a first configuration example of a fourth embodiment of a semiconductor chip to which the present technology is applied.
Figure 18B:
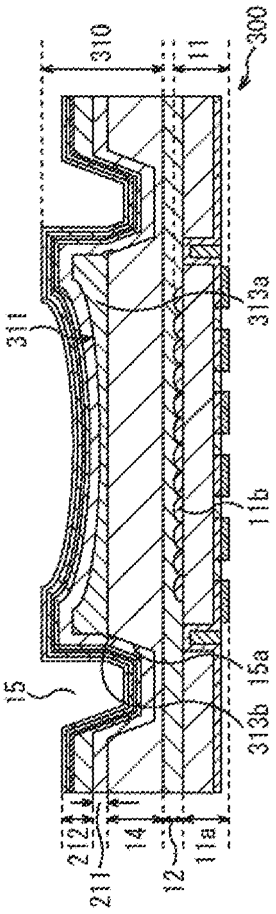

FIGS. 18A and 18B are diagrams showing a first configuration example of a fourth embodiment of a semiconductor chip to which the present technology is applied.

FIG. 18A is a top view of a semiconductor chip 300, and FIG. 18B is a cross-sectional view of the semiconductor chip 300. In the semiconductor chip 300 of FIGS. 18A and 18B, the portions corresponding to those of the semiconductor chip 200 of FIG. 17 are denoted by the same reference numerals. Therefore, the description of the corresponding portions will be omitted as appropriate, and the description will focus on the portions different from the semiconductor chip 200.

The semiconductor chip 300 in FIGS. 18A and 18B are different from the semiconductor chip 200 in that an integrated portion 310 is provided instead of the integrated portion 210, and the other configuration is the same as that of the semiconductor chip 200. The integrated portion 310 is different from the integrated portion 210 in that a lens 311 is provided instead of the lens 16, and the other configuration is the same as that of the integrated portion 210. The lens 311 is an acrylic lens. The lens 311 has a rectangular concave main portion 311_a_ and a hemming portion 311_b_ that is unintentionally formed at the end portion during manufacturing.

<Description of Manufacturing Method>

Figure 19:
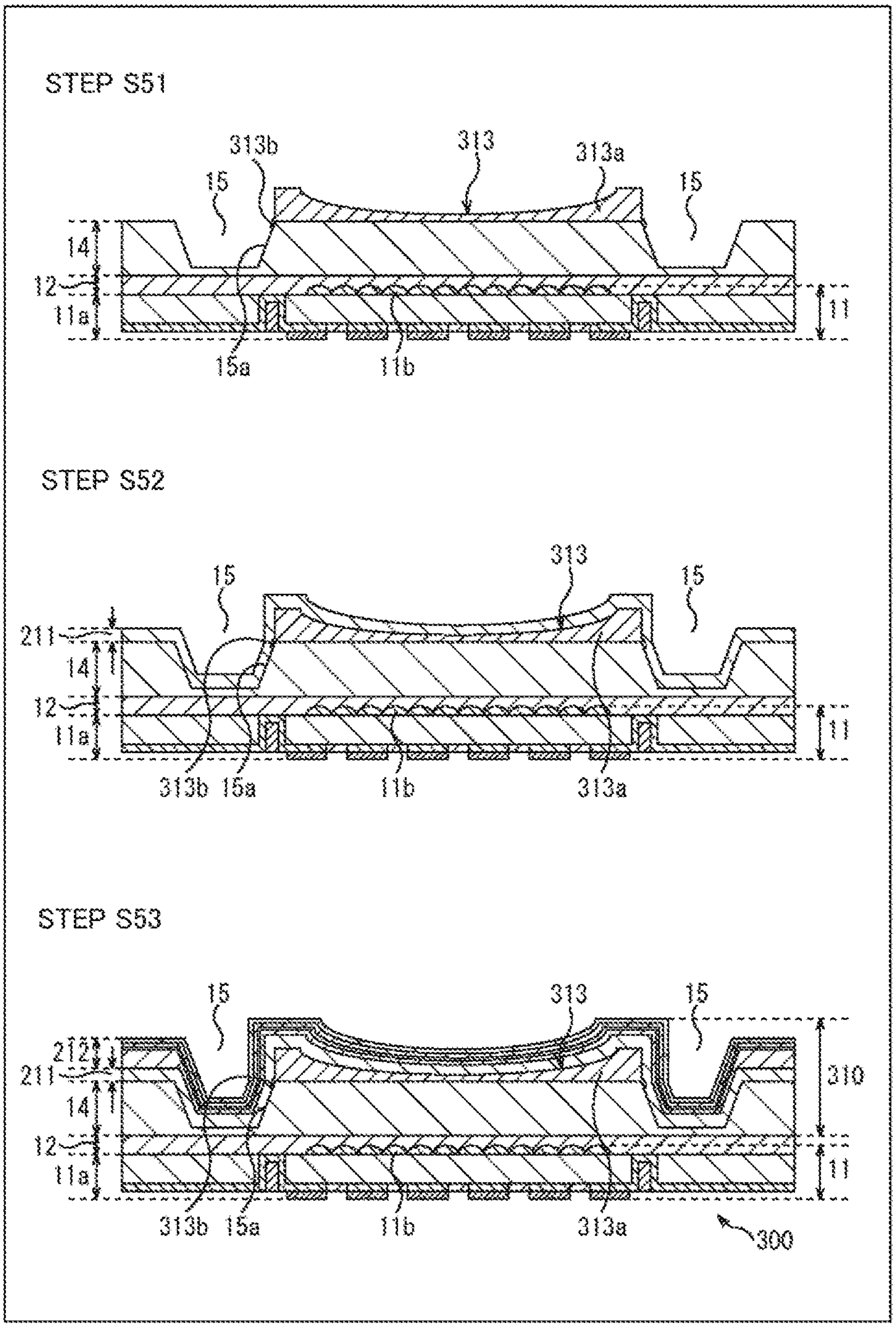
FIG. 19 is a diagram for explaining a method for manufacturing the semiconductor chip of FIGS. 18A and 18B.

FIG. 19 is a diagram for explaining a method for manufacturing the semiconductor chip 300 of FIGS. 18A and 18B.

In step S51 of FIG. 19, the lens 311 is subjected to a plasma treatment. This lens 311 is obtained such that the lens 311 bonded to the solid-state imaging element 11 via the adhesive 12, and is formed in the glass substrate 14, in which the grooves 15 are formed by the same steps as steps S1 to S3 in FIG. 2, by the same steps as steps S4 to S9 in FIGS. 3 and 4.

In step S52, the buffer layer 211 is formed by sputtering or the like on the upper and side surfaces of the lenses 311 and on the regions of the glass substrate 14 where the lenses 311 are not formed. The thickness of this buffer layer 211 is such that it does not break due to its own weight, and the thickness can take any value, for example, 400 nm to 1100 nm, and in this example, the thickness is 800 nm. Moreover, the thickness of the side surfaces of the buffer layer 211 is a thickness necessary for suppressing the intrusion of water, for example, 60% or more of the thickness of the upper surface. The buffer layer 211 may be formed by a method other than sputtering, but the film can be easily formed at a low temperature in the case of sputtering.

In step S53, the AR coating 212 is formed on the entire surface of the buffer layer 211 formed in step S52, and the semiconductor chip 300 is manufactured.

Although the chuck 31 is omitted in FIG. 19, the solid-state imaging element 11 is installed on a chuck or the like. This also applies to FIG. 21, which will be described later.

As described above, the semiconductor chip 300 has the buffer layer 211 between the lens 311 and the AR coating 212. Therefore, like the semiconductor chip 200, damage to the AR coating 212 can be suppressed, and the reliability of the semiconductor chip 300 can be ensured.

<Second Configuration Example of Semiconductor Chip>

Figure 20A:
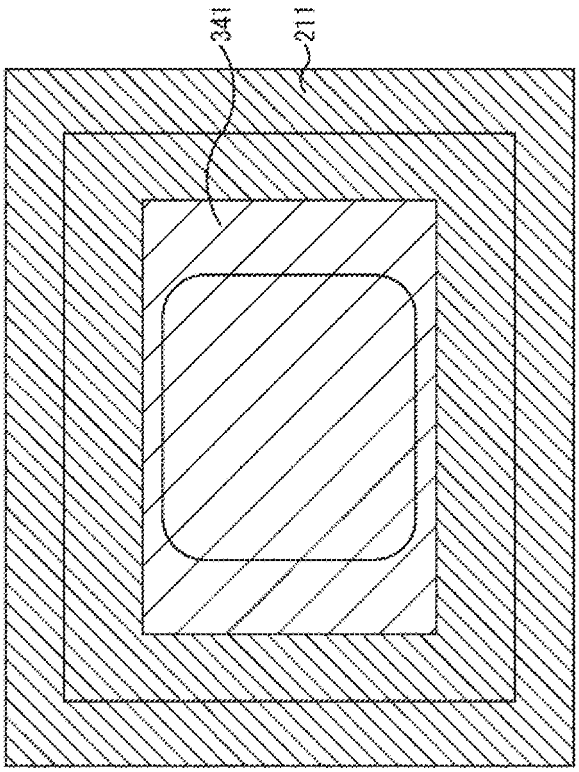
FIGS. 20A and 20B are diagrams showing a second configuration example of the fourth embodiment of the semiconductor chip to which the present technology is applied.
Figure 20B:
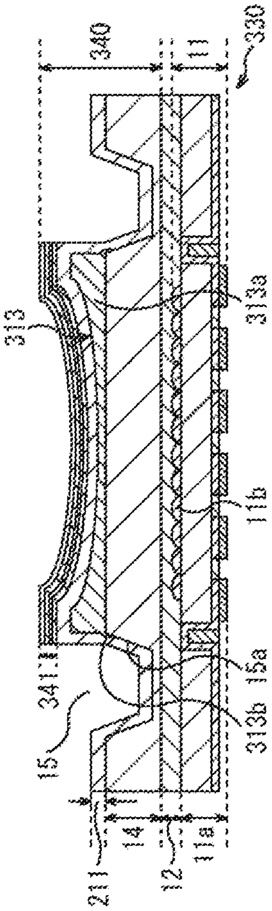

FIGS. 20A and 20B are diagrams showing a second configuration example of the fourth embodiment of the semiconductor chip to which the present technology is applied.

FIG. 20A is a top view of a semiconductor chip 330, and FIG. 20B is a cross-sectional view of the semiconductor chip 330. In the semiconductor chip 330 of FIGS. 20A and 20B, portions corresponding to those of the semiconductor chip 300 of FIGS. 18A and 18B are denoted by the same reference numerals. Therefore, the description of the corresponding portions is omitted as appropriate, and the description focuses on the portions different from the semiconductor chip 300.

The semiconductor chip 330 of FIGS. 20A and 20B are different from the semiconductor chip 300 in that an integrated portion 340 is provided instead of the integrated portion 310, and the other configuration is the same as that of the semiconductor chip 300. The integrated portion 340 is different from the integrated portion 310 in that an AR coating 341 is provided in place of the AR coating 212, and the other configuration is the same as that of the integrated portion 310.

The AR coating 341 covers only the buffer layer 211 formed on the upper surface of the lens 311, instead of the entire surface of the buffer layer 211. That is, only the buffer layer 211 is formed on the side surfaces of the lenses 311 and the regions of the glass substrate 14 where the lenses 311 are not formed.

<Description of Manufacturing Method>

Figure 21:
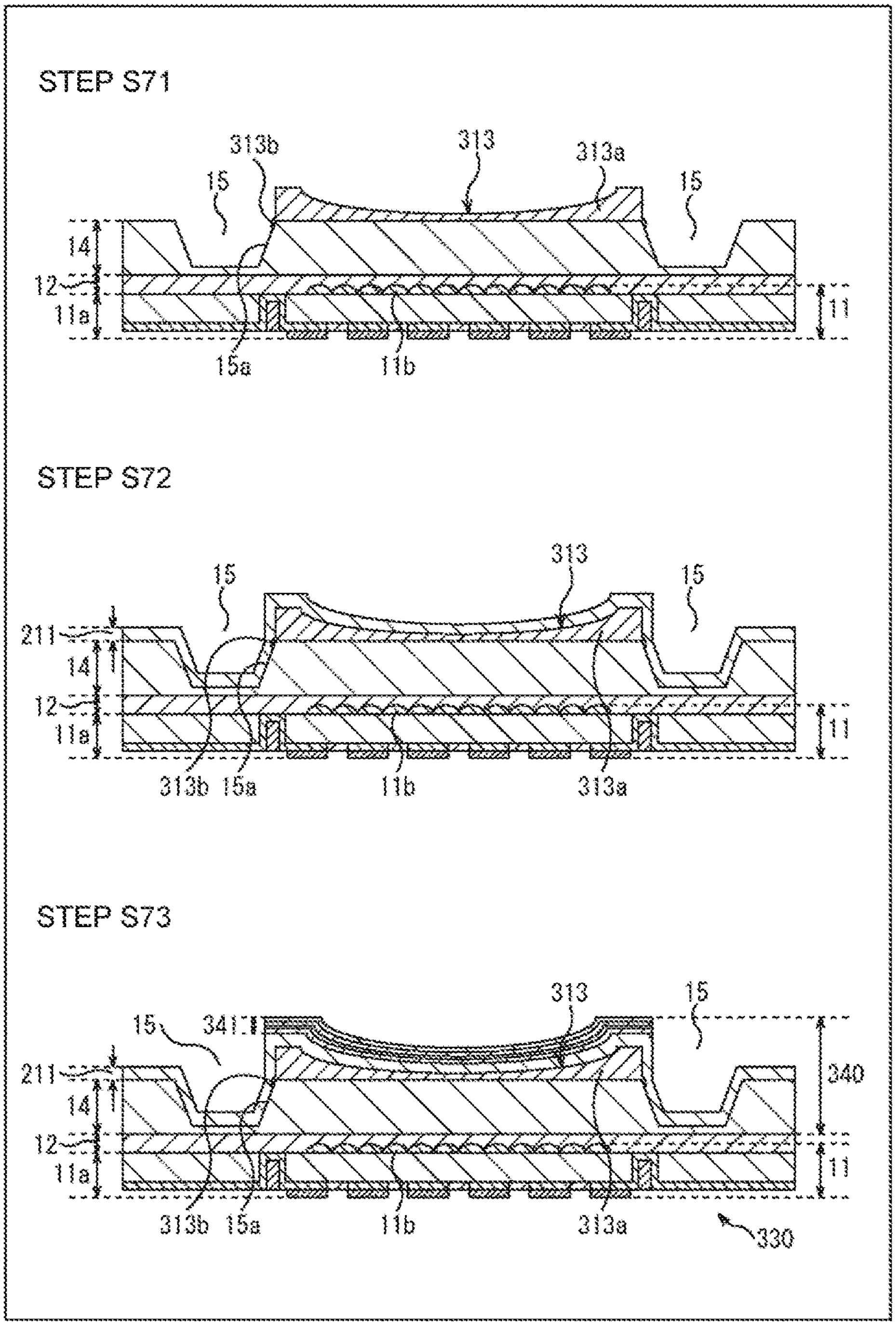
FIG. 21 is a diagram for explaining a method for manufacturing the semiconductor chip of FIGS. 20A and 20B.

FIG. 21 is a diagram for explaining a method for manufacturing the semiconductor chip 330 of FIGS. 20A and 20B.

Steps S71 and S72 in FIG. 21 are the same as steps S51 and S52 in FIG. 19, so description thereof will be omitted. In step S73, the AR coating 212 is formed on the buffer layer 211 on the upper surface of the lens 311 among the buffer layers 211 formed in step S72, and the semiconductor chip 330 is manufactured.

As described above, the semiconductor chip 330 has the buffer layer 211 between the lens 311 and the AR coating 341. Therefore, like the semiconductor chip 200, damage to the AR coating 212 can be suppressed, and the reliability of the semiconductor chip 300 can be ensured.

Moreover, since the AR coating 212 is not formed on the buffer layer 211 on the side surface of the lens 311 in the semiconductor chip 330, the semiconductor chip 300 can be manufactured easily. On the other hand, since the side surfaces (side walls) of the lens 311 do not affect the optical characteristics, the semiconductor chip 330 does not have the AR coating 212 on the buffer layer 211 on the side surfaces of the lens 311, but can have the same optical characteristics as the semiconductor chip 300. In addition, since the buffer layer 211 covers the side surface of the lens 311, it is possible to prevent moisture from entering the lens 311 during a temperature humidity storage test or the like.

As a result, for example, even if it is difficult to form a high-refractive-index film or the like in the horizontal direction (the direction perpendicular to the side surface of the lens 311), the semiconductor chip 330 having optical characteristics and reliability similar to those of the semiconductor chip 300 can be manufactured.

In the fourth embodiment, the integrated portion 310 (340) is formed after the solid-state imaging element 11 is formed. However, like the first embodiment and the second embodiment, the solid-state imaging element 11 and the integrated portion 310 (340) may be manufactured separately, and the integrated portion 310 (340) may be bonded to the solid-state imaging element 11 after manufacturing the integrated portion 310 (330) to form the semiconductor chip 300 (330).

In addition, the number of layers of the AR coatings 212 and 341 is not limited to four, and may be any number. The lenses 16 and 311 may be lenses other than acrylic lenses.

Furthermore, in the third and fourth embodiments, the semiconductor chip 200 (300, 330) has the groove 15, but may have the other grooves 92, 112, 132, or 152 described above.

In FIGS. 1, 14, 17, 18, 19, 20A, 20B, and 21, the structure of the solid-state imaging element 11 is illustrated in a simplified manner, but the solid-state imaging element 11 actually has a laminated structure.

<First Example of Laminated Structure of Solid-State Imaging Element>

Figure 22:
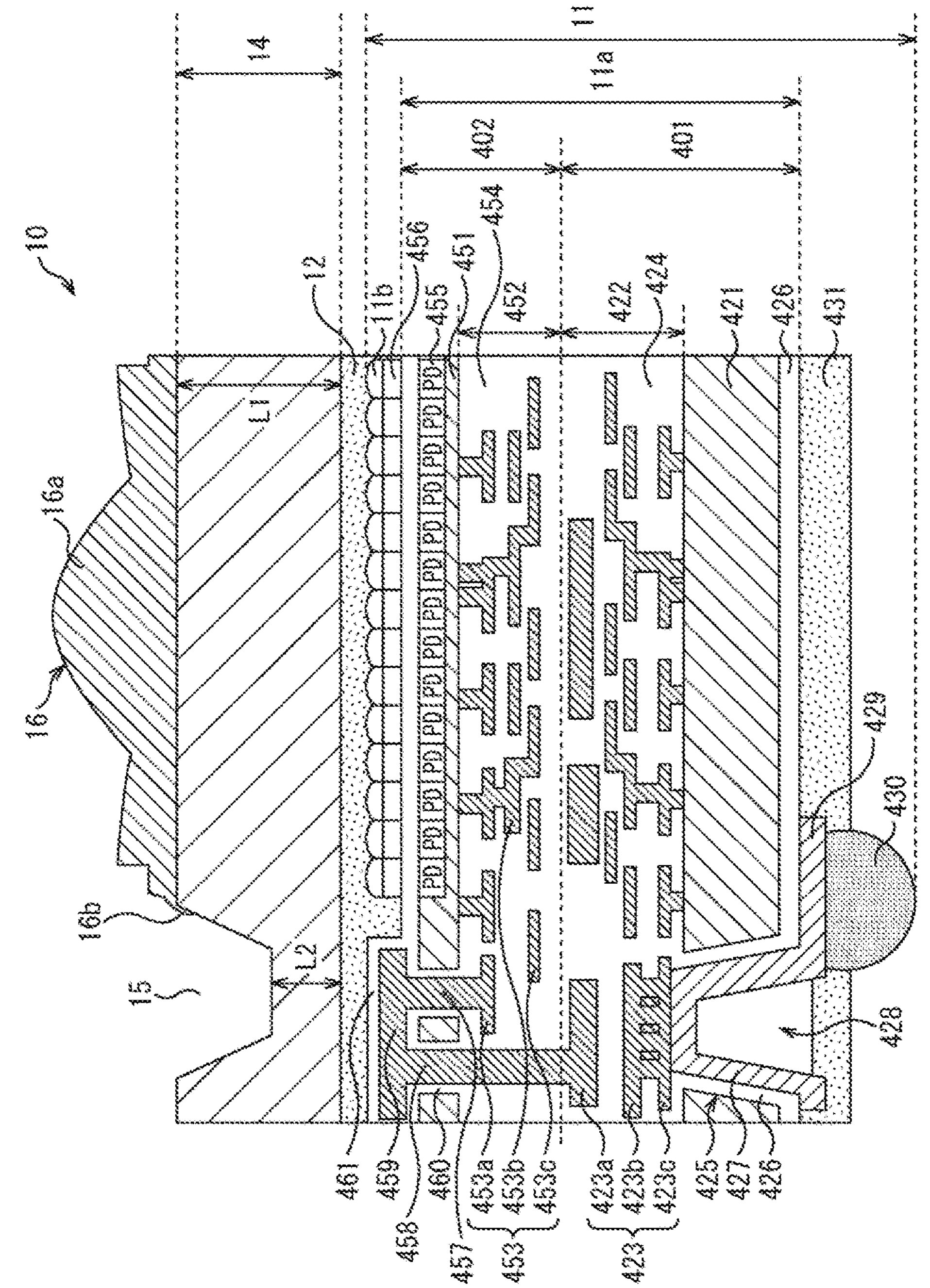
FIG. 22 is a diagram for explaining the details of a first example of a laminated structure of a solid-state imaging element.

With reference to FIG. 22, a first example of the laminated structure of the solid-state imaging element 11 in the semiconductor chip 10 will be described in detail. FIG. 22 is a cross-sectional view showing a portion of the semiconductor chip 10 at an enlarged scale. In the semiconductor chip 10 of FIG. 22, portions corresponding to those in FIG. 1 are denoted by the same reference numerals, and redundant description thereof will be omitted as appropriate.

A laminated substrate 11*a* of the solid-state imaging element 11 of FIG. 22 is configured by laminating a lower substrate 401 and an upper substrate 402. In the lower substrate 401, a multilayer wiring layer 422 is formed on the upper side (upper substrate 402 side) of a semiconductor substrate 421 made of silicon (Si), for example. The multilayer wiring layer 422 constitutes a logic circuit such as a signal processing circuit for processing a pixel signal output from a pixel unit that performs photoelectric conversion for each pixel and a control circuit for controlling the pixel unit. Note that the control circuit may be configured on the upper substrate 402.

The multilayer wiring layer 422 includes a plurality of wiring layers 423 including an uppermost wiring layer 423*a* closest to the upper substrate 402, an intermediate wiring layer 423*b*, and a lowermost wiring layer 423*c* closest to the semiconductor substrate 421 and an interlayer insulating film 424 formed between the wiring layers 423.

The plurality of wiring layers 423 are made, for example, of copper (Cu), aluminum (Al), or tungsten (W), the interlayer insulating film 424 is made, for example, of a silicon oxide film or a silicon nitride film. All the layers of the plurality of wiring layers 423 and the interlayer insulating film 424 may be of the same material or two or more materials may be used among different layers.

A through-silicon hole 425 penetrating through the semiconductor substrate 421 is formed at a predetermined position of the semiconductor substrate 421, and a connecting conductor 427 is embedded in the inner wall of the through-silicon hole 425 via an insulating film 426, whereby a through-silicon electrode (TSV: Through Silicon Via) 428 is formed. The insulating film 426 can be made, for example, of a SiO2 film or a SiN film.

In the through-silicon electrode 428 shown in FIG. 22, the insulating film 426 and the connecting conductor 427 are formed along the inner wall surface, and the inside of the through-silicon hole 425 is hollow. However, depending on an inner diameter, the entire inside of the through-silicon hole 425 may be filled with the connecting conductor 427. In other words, the inside of the through-hole may be filled with a conductor or may be partially hollow. This also applies to a through-chip electrode (TCV: Through Chip Via) 458 and the like, which will be described later.

The connecting conductor 427 of the through-silicon electrode 428 is connected to a rewiring 429 formed on the lower surface side of the semiconductor substrate 421, and the rewiring 429 is connected to a solder ball 430. The connecting conductor 427 and the rewiring 429 can be made, for example, of copper (Cu), tungsten (W), titanium (Ti), tantalum (Ta), titanium-tungsten alloy (TiW), polysilicon, or the like.

A solder mask (solder resist) 431 is formed on the lower surface side of the semiconductor substrate 421 so as to cover the rewiring 429 and the insulating film 426 except for the regions where the solder balls 430 are formed.

On the other hand, in the upper substrate 402, a multilayer wiring layer 452 is formed on the lower side (lower substrate 401 side) of a semiconductor substrate 451 made of silicon (Si). The multilayer wiring layer 452 constitutes the circuit of the pixel unit.

The multilayer wiring layer 452 includes a plurality of wiring layers 453 including an uppermost wiring layer 453*a* closest to the semiconductor substrate 451, an intermediate wiring layer 453*b*, and a lowermost wiring layer 453*c* closest to the lower substrate 401, and an interlayer insulating film 454 formed between the wiring layers 453.

The materials used for the plurality of wiring layers 453 and the interlayer insulating film 454 may be the same kinds of materials as those used for the wiring layers 423 and the interlayer insulating film 424. In addition, one or two or more materials may be used separately for the plurality of wiring layers 453 and the interlayer insulating film 454 similarly to the wiring layers 423 and the interlayer insulating film 424 described above.

In the example of FIG. 22, the multilayer wiring layer 452 of the upper substrate 402 is composed of three wiring layers 453, and the multilayer wiring layer 422 of the lower substrate 401 is composed of four wiring layers 423. The total number of wiring layers is not limited to this, and any number of layers can be formed.

The upper surface of the semiconductor substrate 451 is provided with a light-receiving surface in which photodiodes 455 as photoelectric conversion elements formed by PN junctions are arranged two-dimensionally for each pixel. The photodiode 455 generates and accumulates charges (signal charges) corresponding to the amount of light received.

Although not shown, a plurality of pixel transistors, a memory unit, and the like, other than the photodiodes 455, which constitute the pixel unit is also formed in the semiconductor substrate 451 and the multilayer wiring layer 452.

A through-silicon electrode 457 connected to the wiring layer 453*a* of the upper substrate 402 and a through-chip electrode 458 connected to the wiring layer 423*a* of the lower substrate 401 are formed at a predetermined position of the semiconductor substrate 451 where color filters 456 of the R (red), G (green), or B (blue) and the on-chip lens 11*b* are not formed.

The through-silicon electrode 457 and the through-chip electrode 458 are connected by a connection wiring 459 formed on the upper surface of the semiconductor substrate 451. An insulating film 460 is formed between each of the through-silicon electrode 457 and the through-chip electrode 458 and the semiconductor substrate 451. Furthermore, the color filter 456 and the on-chip lens 11*b* are formed on the upper surface of the semiconductor substrate 451 with an insulating film (planarization film) 461 interposed therebetween.

As described above, the laminated substrate 11*a* of the solid-state imaging element 11 has a laminated structure in which the multilayer wiring layer 422 side of the lower substrate 401 and the multilayer wiring layer 452 side of the upper substrate 402 are bonded together. In FIG. 22, the bonding surface between the multilayer wiring layer 422 of the lower substrate 401 and the multilayer wiring layer 452 of the upper substrate 402 is indicated by a dashed line.

In the laminated substrate 11*a*, the wiring layer 453 of the upper substrate 402 and the wiring layer 423 of the lower substrate 401 are connected by two through-electrodes, that is, the through-silicon electrode 457 and the through-chip electrode 458, and the wiring layer 423 of the lower substrate 401 and the solder balls (rear electrodes) 430 are connected by the through-silicon electrodes 428 and the rewirings 429. As a result, the surface area of the solid-state imaging element 11 can be minimized. Therefore, the semiconductor chip 10 can be miniaturized.

<Second Example of Laminated Structure of Solid-State Imaging Element>

Figure 23:
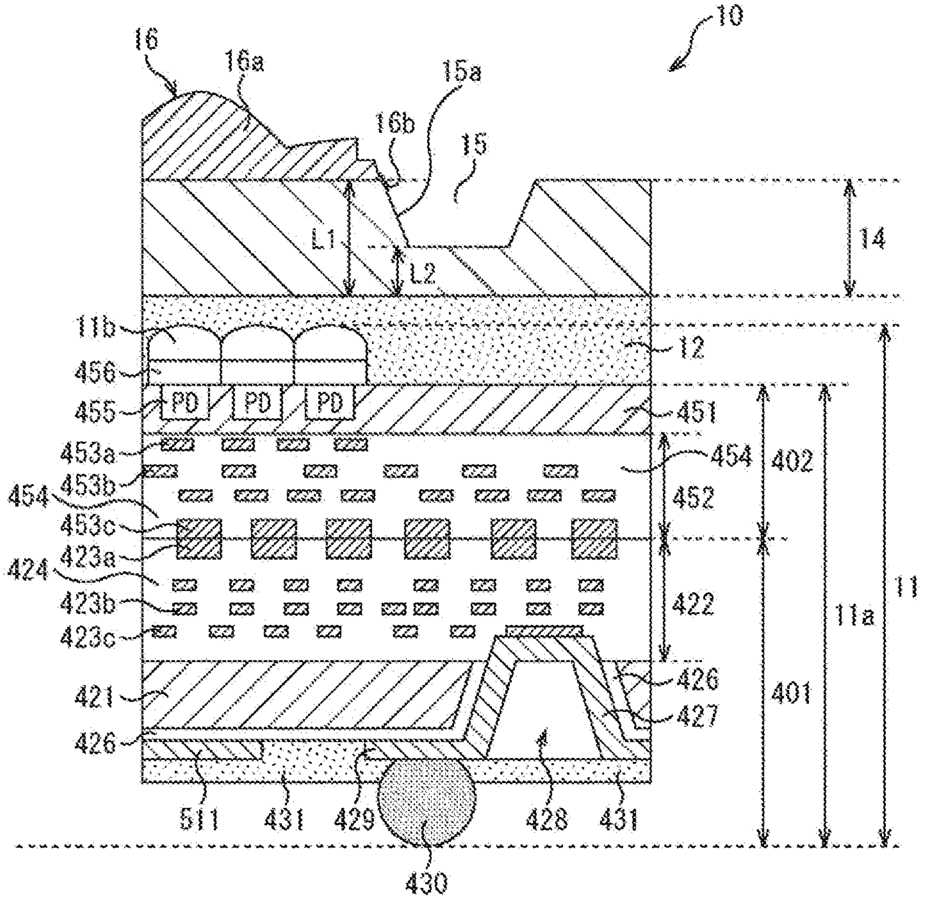
FIG. 23 is a diagram for explaining the details of a second example of the laminated structure of the solid-state imaging element.

FIG. 23 is a diagram for explaining the details of a second example of the laminated structure of the solid-state imaging element 11 in the semiconductor chip 10, and is a cross-sectional view showing a portion of the semiconductor chip 10 at an enlarged scale.

In the solid-state imaging element 11 of FIG. 23, portions corresponding to those of FIG. 22 are denoted by the same reference numerals. Therefore, description of the corresponding portions will be omitted as appropriate, and the description will focus on the portions different from the solid-state imaging element 11 of FIG. 22.

The solid-state imaging element 11 of FIG. 23 is different from the basic structure of FIG. 22 in the method for connecting the lower substrate 401 and the upper substrate 402.

That is, in the solid-state imaging element 11 of FIG. 22, the lower substrate 401 and the upper substrate 402 are connected using two through-electrodes, that is, the through-silicon electrode 457 and the through-chip electrode 458. However, in the solid-state imaging element 11 in FIG. 23, the uppermost wiring layer 423*a* in the multilayer wiring layer 422 of the lower substrate 401 and the lowermost wiring layer 453*c* in the multilayer wiring layer 452 of the upper substrate 402 are connected by metal bonding (Cu—Cu bonding).

The method for connection with the solder balls 430 on the lower side of the solid-state imaging element 11 of FIG. 23 is the same as that of the solid-state imaging element 11 of FIG. 22. In other words, the through-silicon electrodes 428 are connected to the lowermost wiring layer 423*c* of the lower substrate 401, whereby the solder balls 430 are connected to the wiring layers 423 and 453 in the laminated substrate 11*a*.

On the other hand, the solid-state imaging element 11 of FIG. 23 is different from the solid-state imaging element 11 in FIG. 22 in that dummy wirings 511 electrically connected to nowhere are provided on the lower surface side of the semiconductor substrate 421 in the same layer as the rewirings 429 to which the solder balls 430 are connected and are made of the same wiring material as the rewiring 429.

The dummy wiring 511 is provided to reduce the influence of unevenness during metal bonding (Cu—Cu bonding) between the uppermost wiring layer 423*a* on the lower substrate 401 side and the lowermost wiring layer 453*c* on the upper substrate 402 side. That is, when the rewiring 429 is formed only in a partial region of the lower surface of the semiconductor substrate 421 when performing Cu—Cu bonding, unevenness occurs due to the difference in thickness due to the presence or absence of the rewiring 429. Therefore, by providing the dummy wiring 511, the influence of the unevenness can be reduced.

Although illustration is omitted, the structure of the solid-state imaging element 11 in the semiconductor chips 140, 200, 300, and 330 is also the same as that of the solid-state imaging element 11 in FIGS. 22 and 23. In addition, in the first to fourth embodiments, the solid-state imaging element 11 is a back-illuminated CIS having a laminated structure. However, the present invention can also be applied to a CIS without a laminated structure and a front-illuminated CIS.

<5. Application Example to Electronic Device>

The semiconductor chip 10 (140, 200, 300, 330) described above can be applied to various electronic devices such as an imaging device such as a digital still camera or a digital video camera, a mobile phone with an imaging function, or other device with an imaging function.

Figure 24:
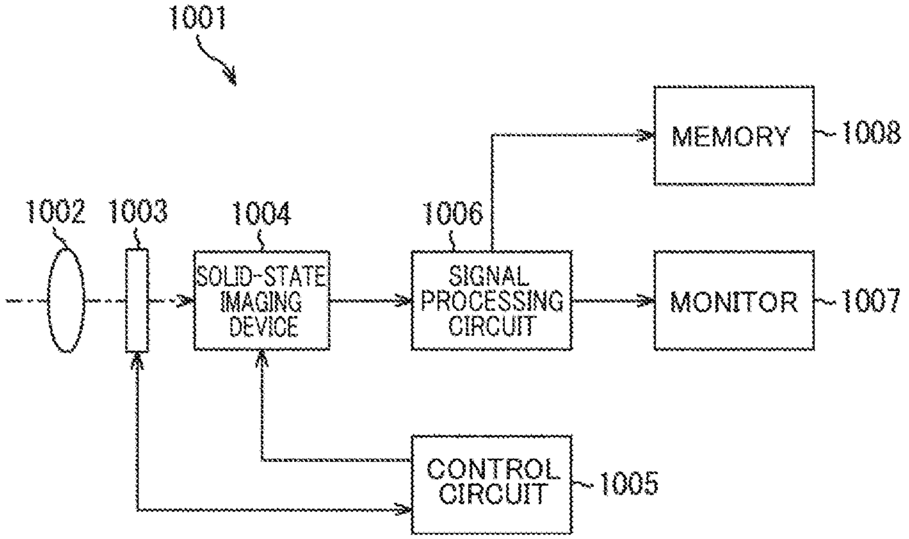
FIG. 24 is a block diagram showing a configuration example of an imaging device as an electronic device to which the present technology is applied.

FIG. 24 is a block diagram showing a configuration example of an imaging device as an electronic device to which the present technology is applied.

The imaging device 1001 shown in FIG. 24 includes an optical system 1002, a shutter device 1003, a solid-state imaging device 1004, a drive circuit 1005, a signal processing circuit 1006, a monitor 1007, and a memory 1008 and can capture still-images and moving images.

The optical system 1002 includes one or more lenses and directs light from an object (incident light) to the solid-state imaging device 1004 and forms an image on the light-receiving surface of the solid-state imaging device 1004.

The shutter device 1003 is arranged between the optical system 1002 and the solid-state imaging device 1004, and controls a light emission period and a light shielding period for the solid-state imaging device 1004 according to control by the drive circuit 1005.

The solid-state imaging device 1004 is configured by the semiconductor chip 10 (140, 200, 300, 330) described above. The solid-state imaging device 1004 accumulates signal charges for a certain period of time according to the light imaged on the light-receiving surface via the optical system 1002 and the shutter device 1003. The signal charges accumulated in the solid-state imaging device 1004 are transferred according to the drive signal (timing signal) supplied from the drive circuit 1005.

The drive circuit 1005 outputs a drive signal that controls the transfer operation of the solid-state imaging device 1004 and the shutter operation of the shutter device 1003, and drives the solid-state imaging device 1004 and the shutter device 1003.

The signal processing circuit 1006 performs various signal processes on the signal charges output from the solid-state imaging device 1004. An image (image data) obtained by the signal processing performed by the signal processing circuit 1006 is supplied to the monitor 1007 for display or supplied to the memory 1008 for storage (recording).

In the imaging device 1001 configured in this way, by applying the semiconductor chip 10 (140, 200, 300, 330) as the solid-state imaging device 1004, the reliability and durability of the imaging device 1001 can be improved.

<6. Usage Example of Semiconductor Chip>

Figure 25:
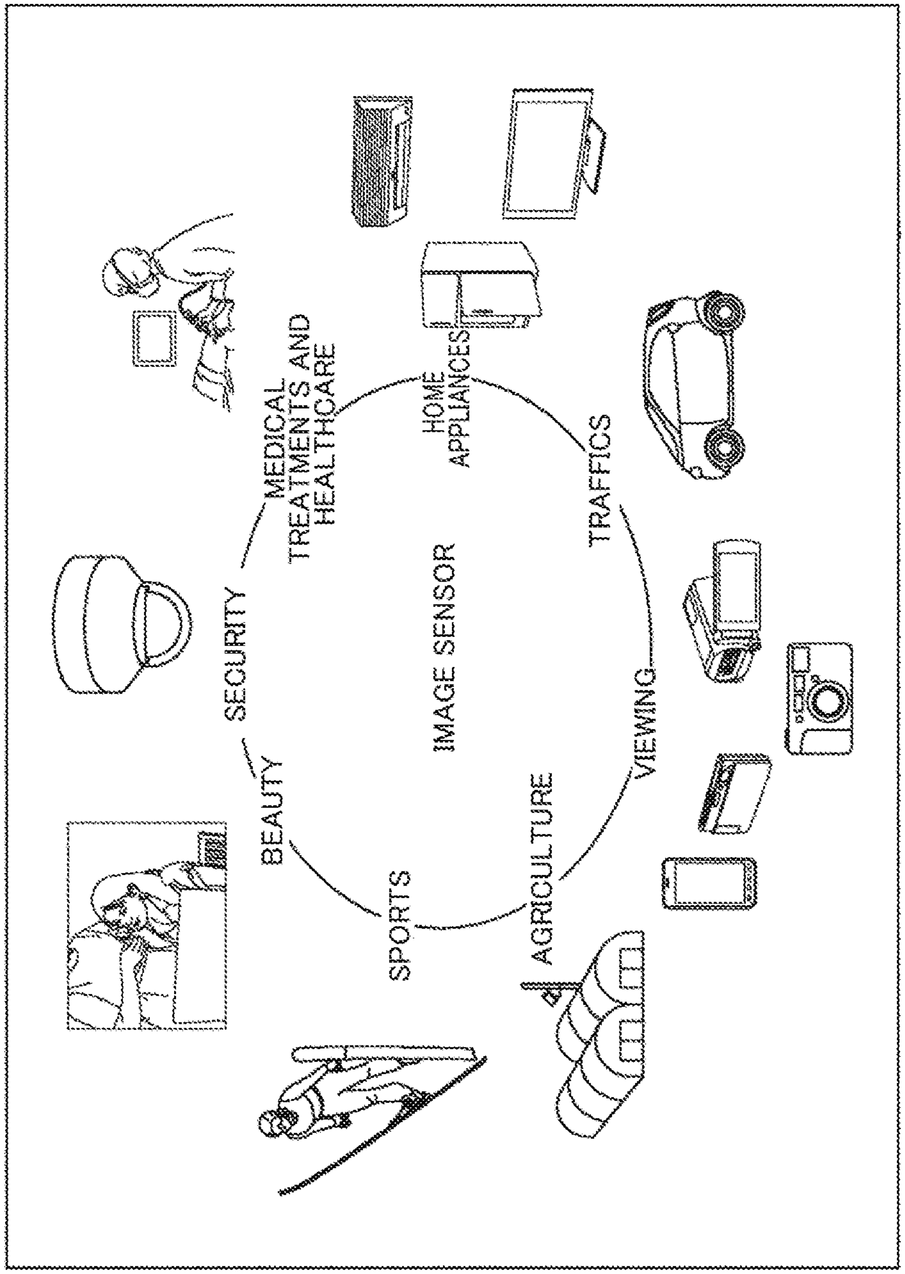
FIG. 25 is a diagram showing a usage example using a semiconductor chip.

FIG. 25 is a diagram showing a usage example using the semiconductor chip 10 (140, 200, 300, 330) described above.

The semiconductor chip 10 (140, 200, 300, 330) described above can be used in various cases for sensing light such as visible light, infrared light, ultraviolet light, and X-rays, for example, as follows.

- Devices that capture images used for viewing, such as digital cameras and mobile devices with camera functions
- Devices used for transportation, such as in-vehicle sensors that capture front, rear, surrounding, and interior-view images of automobiles, monitoring cameras that monitor traveling vehicles and roads, ranging sensors that measure a distance between vehicles, and the like, for safe driving such as automatic stop, recognition of a driver's condition, and the like
- Devices used for home appliances such as TVs, refrigerators, and air conditioners in order to capture an image of a user's gesture and perform device operations in accordance with the gesture
- Devices used for medical treatment and healthcare, such as endoscopes and devices that perform angiography by receiving infrared light
- Devices used for security, such as monitoring cameras for crime prevention and cameras for personal authentication
- Devices used for beauty, such as a skin measuring device that captures images of the skin and a microscope that captures images of the scalp
- Devices used for sports, such as action cameras and wearable cameras for sports applications
- Devices used for agriculture, such as cameras for monitoring conditions of fields and crops <7. Application Example to Endoscopic Surgery System>

The technology of the present disclosure (the present technology) can be applied to various products. For example, the technology according to the present disclosure may be applied to an endoscopic surgery system.

Figure 26:
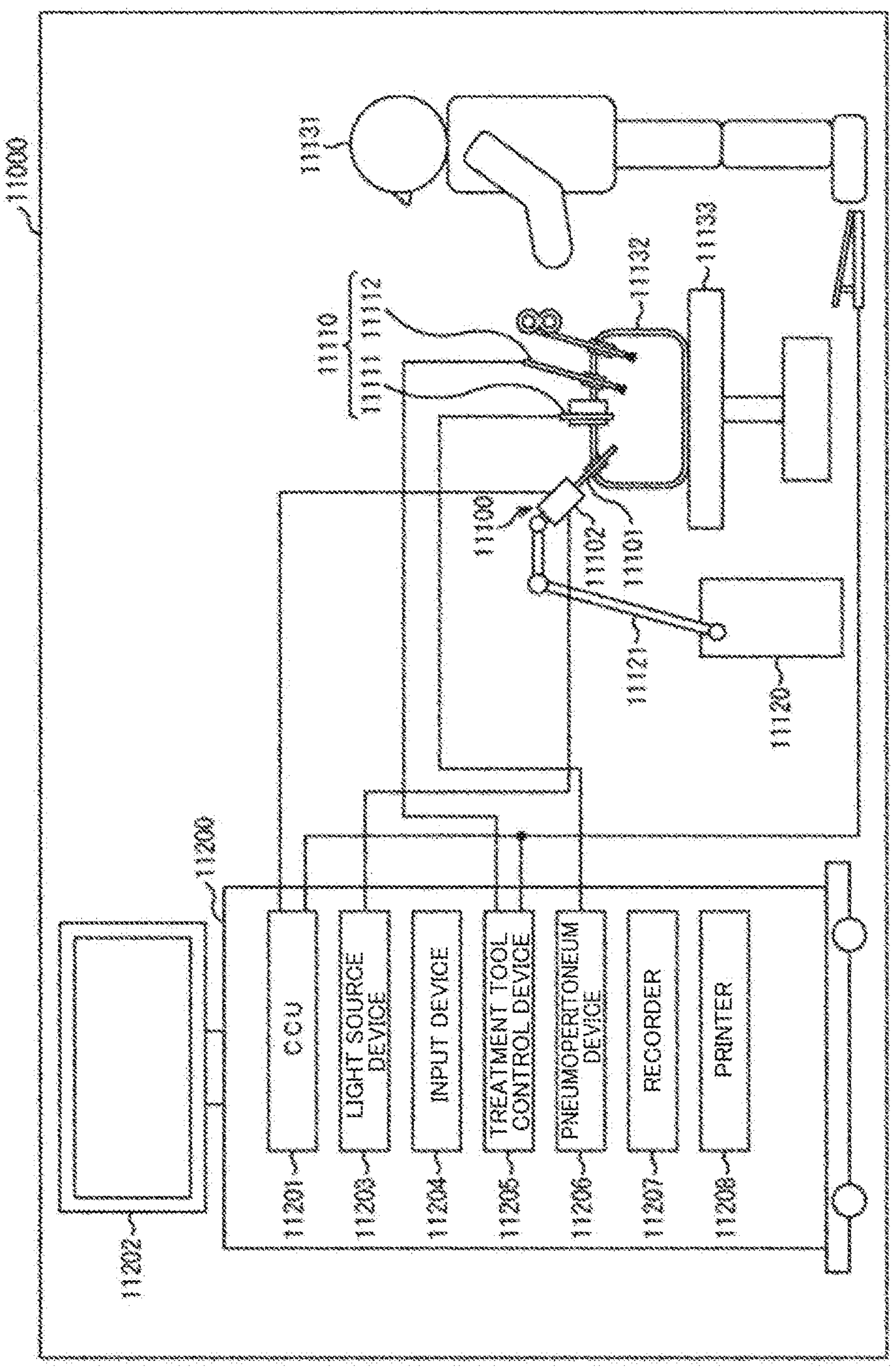
FIG. 26 is a diagram illustrating an example of a schematic configuration of an endoscopic surgery system.

FIG. 26 is a diagram illustrating an example of a schematic configuration of an endoscope surgery system to which the technology according to the present disclosure (the present technology) is applied.

FIG. 26 shows a state where an operator (doctor) 11131 is using an endoscopic surgery system 11000 to perform a surgical operation on a patient 11132 on a patient bed 11133. As illustrated, the endoscopic surgery system 11000 is constituted of an endoscope 11100, another surgical instrument 11110 such as a pneumoperitoneum tube 11111 or an energized treatment tool 11112, a support arm device 11120 that supports the endoscope 11100, and a cart 11200 mounted with various devices for endoscopic surgery.

The endoscope 11100 includes a lens barrel 11101 of which a region having a predetermined length from a tip thereof is inserted into a body cavity of the patient 11132, and a camera head 11102 connected to a base end of the lens barrel 11101. In the illustrated example, the endoscope 11100 configured as a so-called rigid endoscope having the rigid lens barrel 11101 is illustrated, but the endoscope 11100 may be configured as a so-called flexible endoscope having a flexible lens barrel.

The distal end of the lens barrel 11101 is provided with an opening into which an objective lens is fitted. A light source device 11203 is connected to the endoscope 11100, light generated by the light source device 11203 is guided to the distal end of the lens barrel 11101 by a light guide extended to the inside of the lens barrel 11101, and the light is radiated toward an observation target in the body cavity of the patient 11132 through the objective lens. The endoscope 11100 may be a direct viewing endoscope, an oblique-viewing endoscope, or a side-viewing endoscope.

An optical system and an imaging element are provided inside the camera head 11102, and the reflected light (observation light) from the observation target converges on the imaging element by the optical system. The observation light is photoelectrically converted by the imaging element, and an electrical signal corresponding to the observation light, that is, an image signal corresponding to an observation image is generated. The image signal is transmitted to a camera control unit (CCU) 11201 as RAW data.

The CCU 11201 is constituted by a central processing unit (CPU), a graphics processing unit (GPU), and the like and comprehensively controls the operation of the endoscope 11100 and a display device 11202. In addition, the CCU 11201 receives an image signal from the camera head 11102 and performs various types of image processing for displaying an image based on the image signal, for example, development processing (demosaic processing) on the image signal.

The display device 11202 displays the image based on the image signal subjected to the image processing by the CCU 11201 under the control of the CCU 11201.

The light source device 11203 is constituted of, for example, a light source such as an LED (Light Emitting Diode) and supplies the endoscope 11100 with irradiation light when photographing a surgical site or the like.

An input device 11204 is an input interface for the endoscopic surgery system 11000. The user can input various types of information or instructions to the endoscopic surgery system 11000 via the input device 11204. For example, the user inputs an instruction to change imaging conditions (a type of radiation light, a magnification, a focal length, or the like) of the endoscope 11100.

A treatment tool control device 11205 controls driving of the energized treatment tool 11112 for cauterization or incision of a tissue, sealing of blood vessel, or the like. A pneumoperitoneum device 11206 sends a gas into the body cavity of the patient 11132 via the pneumoperitoneum tube 11111 in order to inflate the body cavity for the purpose of securing a field of view using the endoscope 11100 and a working space of the operator. A recorder 11207 is a device capable of recording various types of information on surgery. A printer 11208 is a device capable of printing various types of information on surgery in various formats such as text, images, and graphs.

The light source device 11203 that supplies the endoscope 11100 with the radiation light for imaging the surgical site can be configured of, for example, an LED, a laser light source, or a white light source configured of a combination thereof. When a white light source is formed by a combination of RGB laser light sources, it is possible to control an output intensity and an output timing of each color (each wavelength) with high accuracy, and thus the light source device 11203 can adjust white balance of the captured image. Further, in this case, laser light from each of the respective RGB laser light sources is radiated to the observation target in a time division manner, and driving of the imaging element of the camera head 11102 is controlled in synchronization with radiation timing such that images corresponding to respective RGB can be captured in a time division manner. According to this method, it is possible to obtain a color image without providing a color filter in the imaging element.

Further, driving of the light source device 11203 may be controlled so that an intensity of output light is changed at predetermined time intervals. The driving of the imaging element of the camera head 11102 is controlled in synchronization with a timing of changing the intensity of the light, and images are acquired in a time division manner and combined, such that an image having a high dynamic range without so-called blackout and whiteout can be generated.

In addition, the light source device 11203 may have a configuration in which light in a predetermined wavelength band corresponding to special light observation can be supplied. In the special light observation, for example, by emitting light in a band narrower than that of radiation light (that is, white light) during normal observation using wavelength dependence of light absorption in a body tissue, so-called narrow band light observation (narrow band imaging) in which a predetermined tissue such as a blood vessel in a mucous membrane surface layer is imaged with a high contrast is performed. Alternatively, in the special light observation, fluorescence observation in which an image is obtained by fluorescence generated by emitting excitation light may be performed. The fluorescence observation can be performed by emitting excitation light to a body tissue and observing fluorescence from the body tissue (autofluorescence observation), or locally injecting a reagent such as indocyanine green (ICG) to a body tissue and emitting excitation light corresponding to a fluorescence wavelength of the reagent to the body tissue to obtain a fluorescence image. The light source device 11203 may have a configuration in which narrow band light and/or excitation light corresponding to such special light observation can be supplied.

Figure 27:
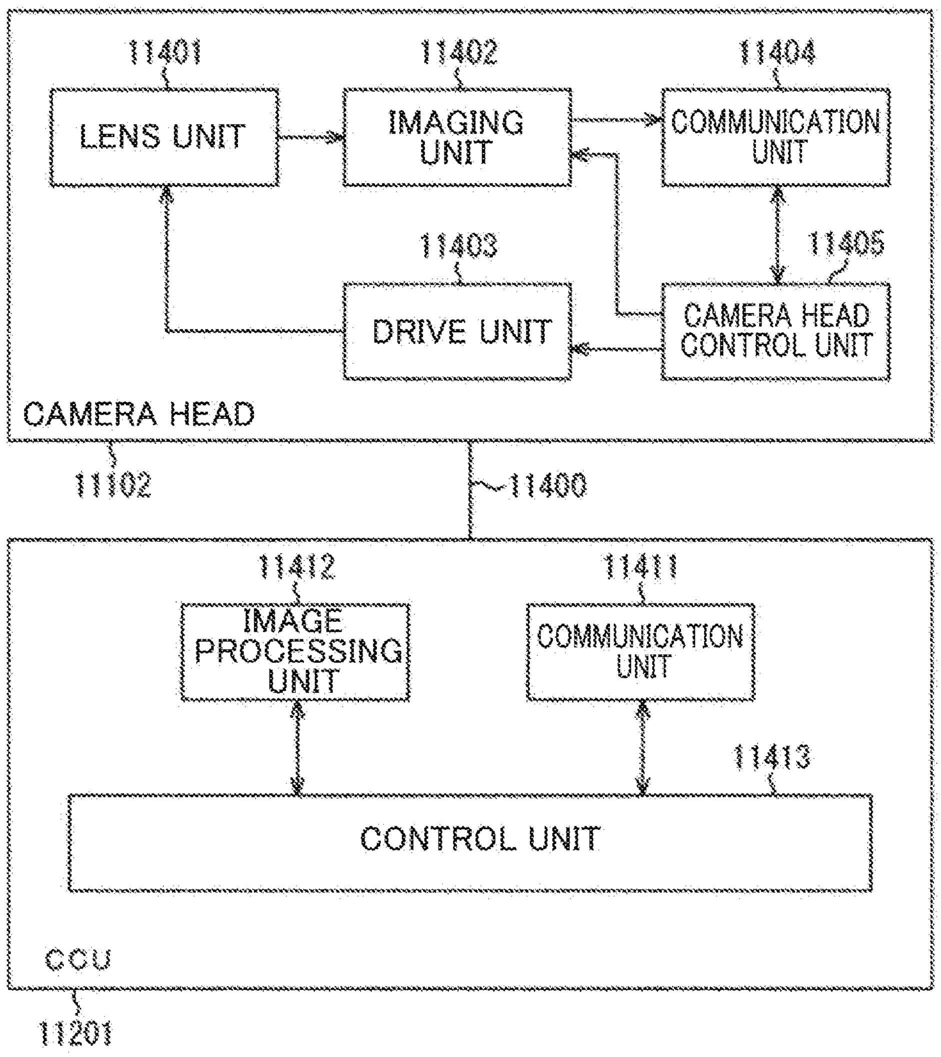
FIG. 27 is a block diagram illustrating an example of a functional configuration of a camera head and a CCU.

FIG. 27 is a block diagram showing an example of functional configurations of the camera head 11102 and the CCU 11201 shown in FIG. 26.

The camera head 11102 includes a lens unit 11401, an imaging unit 11402, a drive unit 11403, a communication unit 11404, and a camera head control unit 11405. The CCU 11201 has a communication unit 11411, an image processing unit 11412, and a control unit 11413. The camera head 11102 and the CCU 11201 are communicatively connected to each other by a transmission cable 11400.

The lens unit 11401 is an optical system provided in a connection portion for connection to the lens barrel 11101. Observation light taken from a tip of the lens barrel 11101 is guided to the camera head 11102 and is incident on the lens unit 11401. The lens unit 11401 is configured in combination of a plurality of lenses including a zoom lens and a focus lens.

The imaging unit 11402 is constituted by an imaging element. The imaging element constituting the imaging unit 11402 may be one element (a so-called single plate type) or a plurality of elements (a so-called multi-plate type). When the imaging unit 11402 is configured as a multi-plate type, for example, image signals corresponding to RGB are generated by the imaging elements, and a color image may be obtained by synthesizing the image signals. Alternatively, the imaging unit 11402 may be configured to include a pair of imaging elements for acquiring image signals for the right eye and the left eye corresponding to three-dimensional (3D) display. When 3D display is performed, the operator 11131 can ascertain the depth of biological tissues in the surgical site more accurately. When the imaging unit 11402 is configured in a multi-plate type, a plurality of systems of lens units 11401 may be provided in correspondence to the imaging elements.

The imaging unit 11402 need not necessarily be provided in the camera head 11102. For example, the imaging unit 11402 may be provided immediately after the objective lens inside of the lens barrel 11101.

The drive unit 11403 is configured by an actuator and the zoom lens and the focus lens of the lens unit 11401 are moved by a predetermined distance along an optical axis under the control of the camera head control unit 11405. Accordingly, the magnification and focus of the image captured by the imaging unit 11402 can be adjusted appropriately.

The communication unit 11404 is configured using a communication device for transmitting and receiving various types of information to and from the CCU 11201. The communication unit 11404 transmits the image signal obtained from the imaging unit 11402 as RAW data to the CCU 11201 via the transmission cable 11400.

The communication unit 11404 receives a control signal for controlling driving of the camera head 11102 from the CCU 11201 and supplies the camera head control unit 11405 with the control signal. The control signal includes, for example, information regarding imaging conditions such as information indicating designation of a frame rate of a captured image, information indicating designation of an exposure value at the time of imaging, and/or information indicating designation of a magnification and a focus of the captured image.

The imaging conditions such as the frame rate, the exposure value, the magnification, and the focus may be appropriately designated by the user, or may be automatically set by the control unit 11413 of the CCU 11201 on the basis of the acquired image signal. In the latter case, a so-called auto exposure (AE) function, a so-called auto focus (AF) function, and a so-called auto white balance (AWB) function are provided in the endoscope 11100.

The camera head control unit 11405 controls driving of the camera head 11102 on the basis of a control signal from the CCU 11201 received via the communication unit 11404.

The communication unit 11411 is constituted of a communication device that transmits and receives various kinds of information to and from the camera head 11102. The communication unit 11411 receives an image signal transmitted via the transmission cable 11400 from the camera head 11102.

Further, the communication unit 11411 transmits the control signal for controlling the driving of the camera head 11102 to the camera head 11102. The image signal or the control signal can be transmitted through electric communication, optical communication, or the like.

The image processing unit 11412 performs various types of image processing on the image signal that is the RAW data transmitted from the camera head 11102.

The control unit 11413 performs various kinds of control on imaging of a surgical site by the endoscope 11100, display of a captured image obtained through imaging of a surgical site, or the like. For example, the control unit 11413 generates a control signal for controlling driving of the camera head 11102.

In addition, the control unit 11413 causes the display device 11202 to display a captured image showing a surgical site or the like on the basis of an image signal subjected to the image processing by the image processing unit 11412. In doing so, the control unit 11413 may recognize various objects in the captured image using various image recognition techniques. For example, the control unit 11413 can recognize a surgical instrument such as forceps, a specific biological site, bleeding, mist or the like at the time of use of the energized treatment tool 11112, or the like by detecting a shape, a color, or the like of an edge of an object included in the captured image. When the display device 11202 is caused to display a captured image, the control unit 11413 may superimpose various kinds of surgery support information on an image of the surgical site for display using a recognition result of the captured image. By displaying the surgery support information in a superimposed manner and presenting it to the operator 11131, a burden on the operator 11131 can be reduced, and the operator 11131 can reliably proceed with the surgery.

The transmission cable 11400 that connects the camera head 11102 and the CCU 11201 is an electrical signal cable compatible with communication of electrical signals, an optical fiber compatible with optical communication, or a composite cable of these.

Here, although wired communication is performed using the transmission cable 11400 in the illustrated example, communication between the camera head 11102 and the CCU 11201 may be performed wirelessly.

An example of an endoscopic surgery system to which the technology according to the present disclosure can be applied has been described above. The technology according to the present disclosure can be applied to the imaging unit 11402 and the like among the configurations described above. Specifically, the semiconductor chip 10 (140, 200, 300, 330) can be applied to the imaging unit 11402. By applying the technology according to the present disclosure to the imaging unit 11402, the reliability and durability of the imaging unit 11402 can be improved.

Here, although the endoscopic surgery system has been described as an example, the technology according to the present disclosure may be applied to other, for example, a microscopic surgery system.

<8. Application Example to Moving Body>

The technology according to the present disclosure (the present technology) can be applied to various products. For example, the technology according to the present disclosure may be realized as a device equipped in any type of moving body such as an automobile, an electric vehicle, a hybrid electric vehicle, a motorcycle, a bicycle, a personal mobility device, an airplane, a drone, a ship, and a robot.

Figure 28:
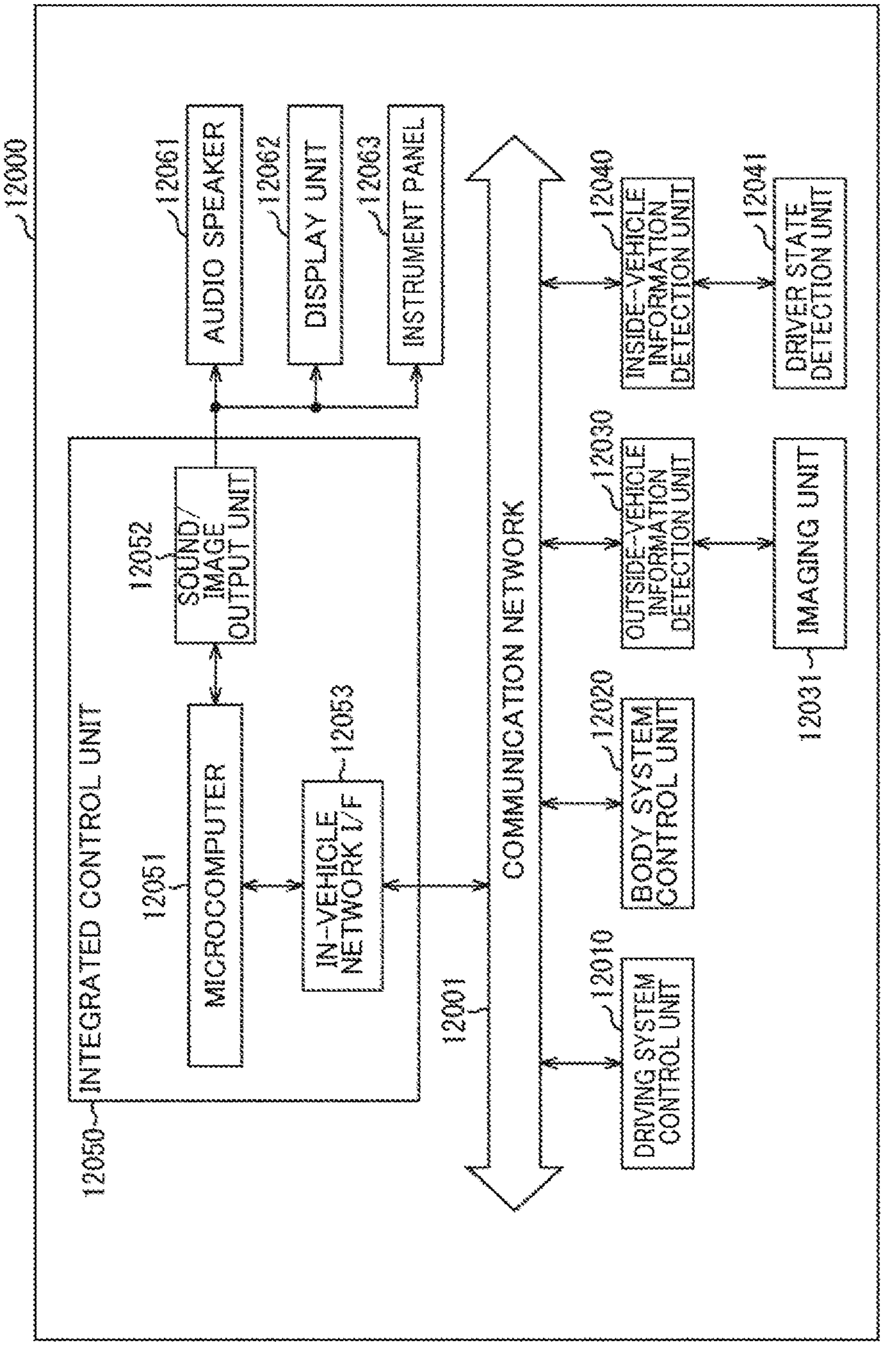
FIG. 28 is a block diagram illustrating an exemplary schematic configuration of a vehicle control system.

FIG. 28 is a block diagram illustrating a schematic configuration example of a vehicle control system, which is an example of a moving body control system to which the technology according to the present disclosure can be applied.

The vehicle control system 12000 includes a plurality of electronic control units connected thereto via a communication network 12001. In the example illustrated in FIG. 28, the vehicle control system 12000 includes a drive system control unit 12010, a body system control unit 12020, an outside-vehicle information detection unit 12030, an inside-vehicle information detection unit 12040, and an integrated control unit 12050. In addition, as a functional configuration of the integrated control unit 12050, a microcomputer 12051, a sound/image output unit 12052, and an in-vehicle network interface (I/F) 12053 are shown.

The drive system control unit 12010 controls an operation of a device related to a drive system of a vehicle according to various programs. For example, the drive system control unit 12010 functions as a driving force generator for generating a driving force of a vehicle such as an internal combustion engine or a driving motor, a driving force transmission mechanism for transmitting a driving force to wheels, a steering mechanism for adjusting a turning angle of a vehicle, and a control device such as a braking device that generates a braking force of a vehicle.

The body system control unit 12020 controls operations of various devices mounted in the vehicle body according to various programs. For example, the body system control unit 12020 functions as a control device of a keyless entry system, a smart key system, a power window device, or various lamps such as a headlamp, a back lamp, a brake lamp, a turn signal, and a fog lamp. In this case, radio waves transmitted from a portable device that substitutes for a key or signals of various switches may be input to the body system control unit 12020. The body system control unit 12020 receives inputs of the radio waves or signals and controls a door lock device, a power window device, and a lamp of the vehicle.

The outside-vehicle information detection unit 12030 detects information on the outside of the vehicle having the vehicle control system 12000 mounted thereon. For example, an imaging unit 12031 is connected to the outside-vehicle information detection unit 12030. The outside-vehicle information detection unit 12030 causes the imaging unit 12031 to capture an image of the outside of the vehicle and receives the captured image. The outside-vehicle information detection unit 12030 may perform object detection processing or distance detection processing for peoples, cars, obstacles, signs, and letters on the road on the basis of the received image.

The imaging unit 12031 is an optical sensor that receives light and outputs an electrical signal according to the amount of the received light. The imaging unit 12031 can also output the electrical signal as an image or distance measurement information. In addition, the light received by the imaging unit 12031 may be visible light or invisible light such as infrared light.

The inside-vehicle information detection unit 12040 detects information on the inside of the vehicle. For example, a driver state detection unit 12041 that detects a driver's state is connected to the inside-vehicle information detection unit 12040. The driver state detection unit 12041 includes, for example, a camera that captures an image of a driver, and the inside-vehicle information detection unit 12040 may calculate a degree of fatigue or concentration of the driver or may determine whether or not the driver is dozing on the basis of detection information input from the driver state detection unit 12041.

The microcomputer 12051 can calculate a control target value of the driving force generation device, the steering mechanism, or the braking device on the basis of the information on the outside or the inside of the vehicle acquired by the outside-vehicle information detection unit 12030 or the inside-vehicle information detection unit 12040 and output a control command to the drive system control unit 12010. For example, the microcomputer 12051 can perform cooperative control for the purpose of realizing functions of an advanced driver assistance system (ADAS) including collision avoidance or impact mitigation of a vehicle, following traveling based on inter-vehicle distance, vehicle speed maintenance driving, vehicle collision warning, vehicle lane deviation warning, or the like.

Further, the microcomputer 12051 can perform cooperative control for the purpose of automated driving or the like in which autonomous travel is performed without depending on operations of the driver, by controlling the driving force generator, the steering mechanism, or the braking device and the like on the basis of information about the surroundings of the vehicle, the information being acquired by the outside-vehicle information detection unit 12030 or the inside-vehicle information detection unit 12040.

In addition, the microcomputer 12051 can output a control command to the body system control unit 12020 based on the information acquired by the outside-vehicle information detection unit 12030 outside the vehicle. For example, the microcomputer 12051 can perform cooperative control for the purpose of preventing glare, such as switching from a high beam to a low beam, by controlling the headlamp according to the position of a preceding vehicle or an oncoming vehicle detected by the outside-vehicle information detection unit 12030.

The sound/image output unit 12052 transmits an output signal of at least one of sound and an image to an output device capable of visually or audibly notifying a passenger or the outside of the vehicle of information. In the example shown in FIG. 28, as such an output device, an audio speaker 12061, a display unit 12062 and an instrument panel 12063 are shown. The display unit 12062 may include, for example, at least one of an onboard display and a head-up display.

Figure 29:
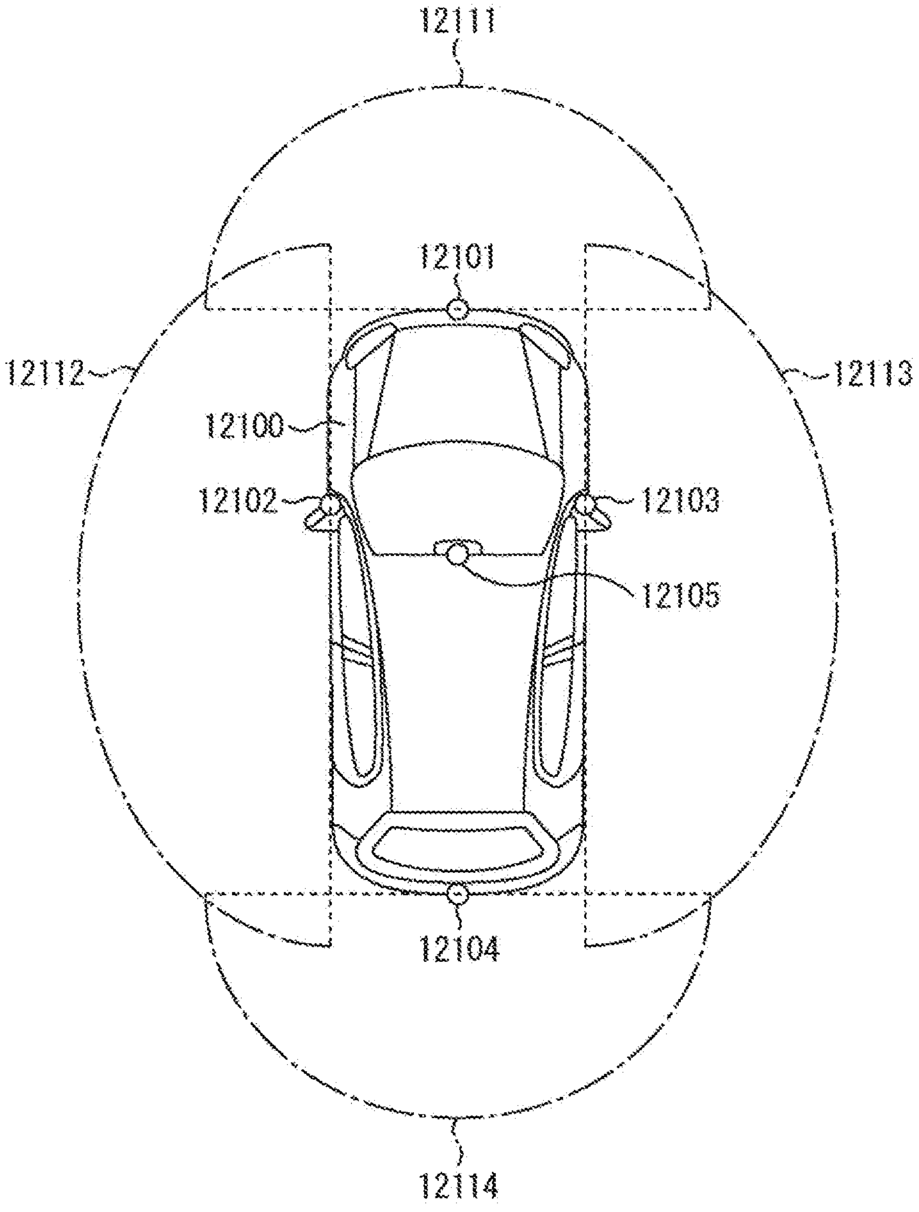
FIG. 29 is an explanatory diagram illustrating an example of the installation positions of an outside-vehicle information detection unit and an imaging unit.

FIG. 29 is a diagram showing an example of an installation position of the imaging unit 12031.

In FIG. 29, a vehicle 12100 includes imaging units 12101, 12102, 12103, 12104, and 12105 as the imaging unit 12031.

The imaging units 12101, 12102, 12103, 12104, and 12105 are provided at positions such as a front nose, side-view mirrors, a rear bumper, a back door, and an upper portion of a windshield in a vehicle interior of the vehicle 12100, for example. The imaging unit 12101 provided on the front nose and the imaging unit 12105 provided in the upper portion of the windshield in the vehicle interior mainly acquire images of the front of the vehicle 12100. The imaging units 12102 and 12103 provided on the side-view mirrors mainly acquire images of a lateral side of the vehicle 12100. The imaging unit 12104 provided on the rear bumper or the back door mainly acquires images of the rear of the vehicle 12100. Front-view images acquired by the imaging units 12101 and 12105 are mainly used for detection of preceding vehicles, pedestrians, obstacles, traffic lights, traffic signs, lanes, and the like.

Here, FIG. 29 shows an example of imaging ranges of the imaging units 12101 to 12104. An imaging range 12111 indicates an imaging range of the imaging unit 12101 provided at the front nose, imaging ranges 12112 and 12113 respectively indicate the imaging ranges of the imaging units 12102 and 12103 provided at the side-view mirrors, and an imaging range 12114 indicates the imaging range of the imaging unit 12104 provided at the rear bumper or the back door. For example, a bird's-eye-view image of the vehicle 12100 as viewed from above can be obtained by superimposing pieces of image data captured by the imaging units 12101 to 12104.

At least one of the imaging units 12101 to 12104 may have a function for obtaining distance information. For example, at least one of the imaging units 12101 to 12104 may be a stereo camera constituted by a plurality of imaging elements or may be an imaging element that has pixels for phase difference detection.

For example, the microcomputer 12051 can extract, particularly, a closest three-dimensional object on a path along which the vehicle 12100 is traveling, which is a three-dimensional object traveling at a predetermined speed (for example, 0 km/h or higher) in the substantially same direction as the vehicle 12100, as a preceding vehicle by acquiring a distance to each of three-dimensional objects in the imaging ranges 12111 to 12114 and temporal change in the distance (a relative speed with respect to the vehicle 12100) on the basis of the distance information obtained from the imaging units 12101 to 12104. Further, the microcomputer 12051 can set an inter-vehicle distance which should be secured in front of the vehicle in advance with respect to the preceding vehicle and can perform automated brake control (also including following stop control) or automated acceleration control (also including following start control). In this way, it is possible to perform cooperative control for the purpose of automated driving or the like in which a vehicle autonomously travels without depending on operations of the driver.

For example, the microcomputer 12051 can classify and extract three-dimensional data regarding three-dimensional objects into two-wheeled vehicles, normal vehicles, large vehicles, pedestrians, and other three-dimensional objects such as electric poles based on distance information obtained from the imaging units 12101 to 12104 and can use the three-dimensional data to perform automated avoidance of obstacles. For example, the microcomputer 12051 differentiates surrounding obstacles of the vehicle 12100 into obstacles which can be viewed by the driver of the vehicle 12100 and obstacles which are difficult to view. Then, the microcomputer 12051 determines a collision risk indicating the degree of risk of collision with each obstacle, and when the collision risk is equal to or higher than a set value and there is a possibility of collision, an alarm is output to the driver through the audio speaker 12061 or the display unit 12062, forced deceleration or avoidance steering is performed through the drive system control unit 12010, and thus it is possible to perform driving support for collision avoidance.

At least one of the imaging units 12101 to 12104 may be an infrared camera that detects infrared rays. For example, the microcomputer 12051 can recognize a pedestrian by determining whether there is a pedestrian in the captured image of the imaging units 12101 to 12104. Such pedestrian recognition is performed by, for example, a procedure in which feature points in the captured images of the imaging units 12101 to 12104 as infrared cameras are extracted and a procedure in which pattern matching processing is performed on a series of feature points indicating an outline of an object to determine whether or not the object is a pedestrian. When the microcomputer 12051 determines that there is a pedestrian in the captured images of the imaging units 12101 to 12104 and the pedestrian is recognized, the sound/image output unit 12052 controls the display unit 12062 so that a square contour line for emphasis is superimposed and displayed with the recognized pedestrian. In addition, the sound/image output unit 12052 may control the display unit 12062 so that an icon indicating a pedestrian or the like is displayed at a desired position.

An example of a vehicle control system to which the technology according to the present disclosure can be applied has been described above. The technology according to the present disclosure can be applied to the imaging unit 12031 and the like among the configurations described above. Specifically, the semiconductor chip 10 (140, 200, 300, 330) can be applied to the imaging unit 12031. By applying the technology according to the present disclosure to the imaging unit 12031, the reliability and durability of the imaging unit 12031 can be improved.

The embodiments of the present technology are not limited to the aforementioned embodiments, and various changes can be made without departing from the gist of the present technology.

For example, a combination of all or part of the above-mentioned plurality of embodiments may be employed.

The advantageous effects described herein are merely exemplary and are not limited, and other advantageous effects of the advantageous effects described in the present specification may be achieved.

The present technology can be configured as follows.

(1)

A semiconductor chip including:

an imaging element;

a glass substrate provided on the imaging element; and a lens formed on the glass substrate, wherein the glass substrate has a groove around a region where the lens is formed.

(2)

The semiconductor chip according to (1), wherein a side surface of the groove is an inclined surface.

(3)

The semiconductor chip according to (1) or (2), wherein a side surface of the groove is processed to prevent regular reflection of light.

(4)

The semiconductor chip according to any one of (1) to (3), wherein the groove has a curved bottom surface.

(5)

The semiconductor chip according to any one of (1) to (3), wherein a bottom surface of the groove is processed to increase a surface area compared to when the bottom surface of the groove is flat.

(6)

The semiconductor chip according to (5), wherein the bottom surface of the groove has unevenness.

(7)

The semiconductor chip according to any one of (1) to (6), further including:

an anti-reflection film formed on the lens; and a buffer layer formed between the lens and the anti-reflection film.

(8)

The semiconductor chip according to (7), wherein the buffer layer is a film with a low refractive index.

(9)

The semiconductor chip according to (7), wherein the buffer layer is formed on upper and side surfaces of the lens.

(10)

The semiconductor chip according to (9), wherein a thickness of the side surface of the buffer layer is 60% or more of a thickness of the upper surface.

(11)

The semiconductor chip according to (9) or (10), wherein the anti-reflection film is formed on the upper and side surfaces of the lens.

(12)

The semiconductor chip according to (9) or (10), wherein the anti-reflection film is formed on the upper surface of the lens.

(13)

A method for manufacturing a semiconductor chip, including:

forming a groove around a region where a lens is formed, on a glass substrate provided on an imaging element; and forming the lens in the region of the glass substrate where the lens is formed.

(14)

The method for manufacturing the semiconductor chip according to (13), wherein a buffer layer is formed on the lens, and an anti-reflection film is formed on the buffer layer.

(15)

An electronic device including:

a semiconductor chip including:

an imaging element;

a glass substrate provided on the imaging element; and a lens formed on the glass substrate; and the glass substrate having a groove around a region where the lens is formed, a signal processing circuit that processes signals from the semiconductor chip.

REFERENCE SIGNS LIST

10 Semiconductor chip
11 Solid-state imaging element
14 Glass substrate
15 Groove
16 Lens
91 Glass substrate
92 Groove
**92*a*** Side surface

111 Glass substrate
112 Groove
**112*a*** Side surface
131 Glass substrate
132 Groove
140 Semiconductor chip
151 Glass substrate
152 Groove
211 Buffer layer
212 AR coating
300 Semiconductor chip
311 Lens
330 Semiconductor chip
341 AR coating
1001 Imaging device
1006 Signal processing circuit

The invention claimed is:

1. A semiconductor chip, comprising:
an imaging element;
a glass substrate on the imaging element;
a lens on a region of the glass substrate, wherein the glass substrate has a groove around the region;
an anti-reflection film on the lens; and
a buffer layer between the lens and the anti-reflection film.

2. The semiconductor chip according to claim 1, wherein a side surface of the groove is an inclined surface.

3. The semiconductor chip according to claim 1, wherein a side surface of the groove is configured to prevent regular reflection of light.

4. The semiconductor chip according to claim 1, wherein the groove has a curved bottom surface.

5. The semiconductor chip according to claim 1, wherein a bottom surface of the groove has a greater surface area compared to when the bottom surface of the groove is flat.

6. The semiconductor chip according to claim 5, wherein the bottom surface of the groove has unevenness.

7. The semiconductor chip according to claim 1, wherein the buffer layer is a film with a low refractive index.

8. The semiconductor chip according to claim 1, wherein the buffer layer is on an upper surface and a side surface of the lens.

9. The semiconductor chip according to claim 8, wherein a thickness of the buffer layer on the side surface is 60% or more of a thickness of the buffer layer on the upper surface.

10. The semiconductor chip according to claim 8, wherein the anti-reflection film is on the upper surface and the side surface of the lens.

11. The semiconductor chip according to claim 8, wherein the anti-reflection film is on the upper surface of the lens.

12. An electronic device, comprising:
a semiconductor chip including:
an imaging element;
a glass substrate on the imaging element;
a lens on a region of the glass substrate, wherein the glass substrate has a groove around the region;
an anti-reflection film on the lens; and
a buffer layer between the lens and the anti-reflection film; and
a signal processing circuit configured to process signals from the semiconductor chip.

13. A semiconductor chip, comprising:
an imaging element;
a glass substrate on the imaging element; and
a lens on a region of the glass substrate, wherein
the glass substrate has a groove around the region, and
a side surface of the groove is configured to prevent regular reflection of light.

* * * * *